(12) United States Patent
Yu et al.

(10) Patent No.: US 7,576,006 B1
(45) Date of Patent: Aug. 18, 2009

(54) PROTECTIVE SELF-ALIGNED BUFFER LAYERS FOR DAMASCENE INTERCONNECTS

(75) Inventors: Yongsik Yu, Lake Oswego, OR (US);
Mandyam Sriram, Beaverton, OR (US);
Roey Shaviv, Palo Alto, CA (US);
Kaushik Chattopadhyay, San Jose, CA (US); Hui-Jung Wu, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/888,323

(22) Filed: Jul. 30, 2007

Related U.S. Application Data

(63) Continuation of application No. 11/726,363, filed on Mar. 20, 2007, which is a continuation-in-part of application No. 11/709,293, filed on Feb. 20, 2007, which is a continuation-in-part of application No. 10/980,076, filed on Nov. 3, 2004, now Pat. No. 7,396,759.

(51) Int. Cl.
*H01L 21/44* (2006.01)
(52) U.S. Cl. .................. 438/687; 438/624; 438/625; 438/680; 257/E21.575
(58) Field of Classification Search ......... 438/622–625, 438/627–628, 641, 687; 257/E21.575
See application file for complete search history.

(56) References Cited

U.S. PATENT DOCUMENTS

| | | | |
|---|---|---|---|
| 4,282,268 A | 8/1981 | Priestley et al. | |
| 6,143,657 A | 11/2000 | Liu et al. | |
| 6,181,013 B1 | 1/2001 | Liu et al. | |
| 6,271,595 B1 | 8/2001 | McGahay et al. | |
| 6,750,541 B2 * | 6/2004 | Ohtsuka et al. | 257/750 |
| 6,821,890 B2 | 11/2004 | McGahay et al. | |
| 6,855,645 B2 | 2/2005 | Tang et al. | |
| 7,060,619 B2 | 6/2006 | Cowley et al. | |

(Continued)

FOREIGN PATENT DOCUMENTS

JP    2000-252278    9/2000

OTHER PUBLICATIONS

U.S. Appl. No. 11/709,293, filed Feb. 20, 2007, Entitled "Protective Self-Aligned Buffer Layers For Damascene Interconnects".

(Continued)

*Primary Examiner*—Thanhha Pham
(74) *Attorney, Agent, or Firm*—Weaver Austin Villeneuve & Sampson LLP

(57) ABSTRACT

Capping protective self aligned buffer (PSAB) layers are layers of material that are selectively formed at the surface of metal layers in a partially fabricated semiconductor device. Encapsulating PSAB layers are formed not only at the surface of the metal layers, but also within the unexposed portions of the metal lines. Encapsulating PSAB layer, for example, can surround the metal line with the PSAB material, thereby protecting interfaces between the metal line and diffusion barriers. Encapsulating PSAB layers can be formed by treating the exposed surfaces of metal lines with $GeH_4$. Capping PSAB layers can be formed by treating the exposed surfaces of metal lines with $SiH_4$. Interconnects having both a silicon-containing capping PSAB layer and a germanium-containing encapsulating PSAB layer provide good performance in terms of adhesion, resistance shift, and electromigration characteristics.

19 Claims, 10 Drawing Sheets

U.S. PATENT DOCUMENTS

| | | | |
|---|---|---|---|
| 7,239,017 | B1 | 7/2007 | Yu et al. |
| 7,247,946 | B2 | 7/2007 | Bruley et al. |
| 7,282,438 | B1 | 10/2007 | Yu et al. |
| 7,396,759 | B1 | 7/2008 | Van Schravendijk et al. |
| 7,420,275 | B1 | 9/2008 | Yu et al. |
| 2001/0006701 | A1* | 7/2001 | Kobayashi et al. ............ 427/99 |
| 2004/0097075 | A1 | 5/2004 | Bradshaw et al. |
| 2004/0238963 | A1 | 12/2004 | Fujisawa |
| 2006/0046479 | A1 | 3/2006 | Rajagopalan et al. |
| 2007/0035029 | A1 | 2/2007 | Caubet et al. |
| 2007/0037388 | A1 | 2/2007 | Hohage et al. |

OTHER PUBLICATIONS

U.S. Appl. No. 11/709,294, filed Feb. 20, 2007, Entitled: "Protective Self-Aligned Buffer Layers For Damascene Interconnects".

U.S. Appl. No. 11/710,652, filed Feb. 22, 2007, Entitled: "Improved Diffusion Barrier And Etch Stop Films".

Office Action dated Jun. 13, 2007, Novellus Systems, Inc., van Schravendijk et al., "Protection of CU Damascene Interconnects by Formation of a Self-Aligned Buffer Layer" U.S. Appl. No. 10/980,076, filed Nov. 3, 2004.

Renesas Technology Corp., Japan, "Reliability Improvement and its Mechanism for Cu Interconnects with Cu-Al Alloy Seeds", pp. 77 & 78 (not dated).

IEEE 07CH37867 45th Annual International Reliability Physics Symposium, Phoenix, 2007, NEC Electronics Corporation, Japan "Analytical Study of Impurity Doping Effects on Electromigration of Cu Interconnects by Employing Comprehensive Scattering Model", pp. 117-121.

IEEE © 2004, Taiwan Semiconductor Manufacturing Company, Ltd., "High Performanc Cu interconnects capped with Full-Coverage ALD TaNx layer for Cu/Low-k (k~2.5) Metallization", pp. 72-74.

IEEE © 2005, NEC Corporation and NEC Electronics, Japan, A Robust 45 nm-node, Dual Damascene Interconnects with High Quality Cu/barrier Interface by a Novel Oxygen Absorption Process (4) four pages.

U.S. Office Action, mailed Nov. 28, 2007, for U.S. Appl. No. 10/980,076.

* cited by examiner

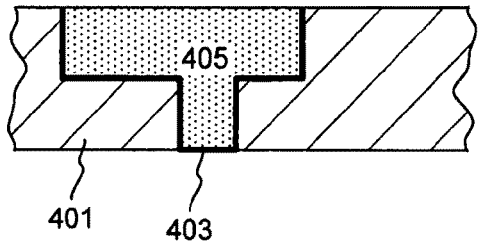
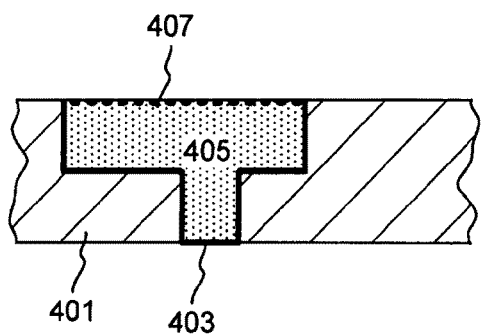
Figure 4A Figure 4B
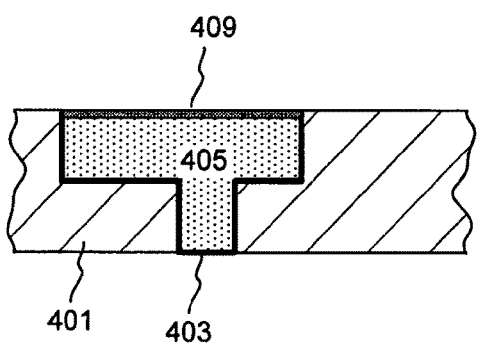
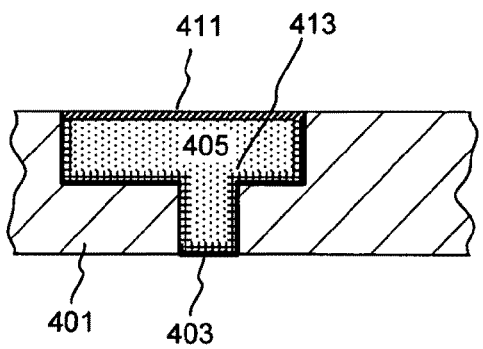
Figure 4C Figure 4D
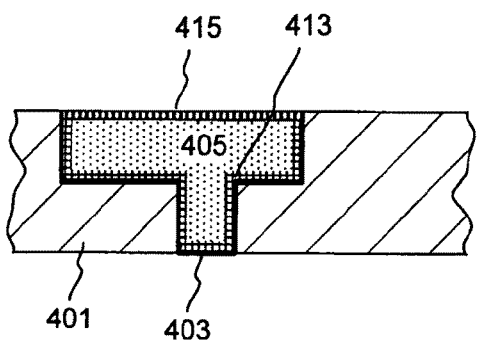
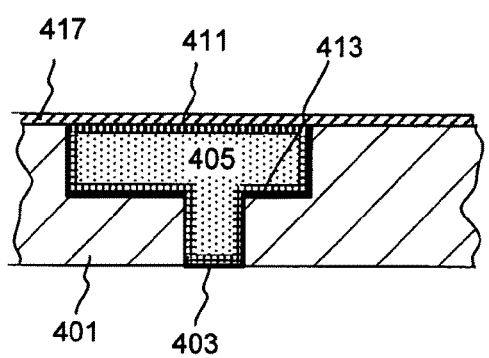
Figure 4E Figure 4F

PROTECTIVE SELF-ALIGNED BUFFER LAYERS FOR DAMASCENE INTERCONNECTS

CROSS-REFERENCE TO RELATED APPLICATIONS

This application is a continuation claiming priority from U.S. patent application Ser. No. 11/726,363, titled "Protective Self-aligned Buffer Layers for Damascene Interconnects" filed Mar. 20, 2007, naming Yu et al. as inventors, which is a continuation-in-part claiming priority from U.S. patent application Ser. No. 11/709,293, titled "Protective Self-aligned Buffer Layers for Damascene Interconnects" filed Feb. 20, 2007, naming Chattopadhyay et al. as inventors, which is a continuation-in-part claiming priority from U.S. patent application Ser. No. 10/980,076 filed Nov. 3, 2004, now U.S. Pat. No. 7,396,759 titled "Protection of Cu Damascene Interconnects by Formation of a Self-aligned Buffer Layer," naming van Schravendijk et al. as inventors, which are incorporated herein by reference in their entirety and for all purposes.

FIELD OF THE INVENTION

The present invention pertains to methods of forming layers of material on a partially fabricated integrated circuit. Specifically, the invention pertains to methods for forming capping and encapsulating protective self-aligned buffer (PSAB) layers for use in Damascene interconnects.

BACKGROUND OF THE INVENTION

Damascene processing is a method for forming metal lines on integrated circuits. It involves formation of inlaid metal lines in trenches and vias formed in a dielectric layer (inter metal dielectric). Damascene processing is often a preferred method because it requires fewer processing steps than other methods and offers a higher yield. It is also particularly well-suited to metals such as copper that cannot be readily patterned by plasma etching.

In a typical Damascene process flow, metal is deposited onto a patterned dielectric to fill the vias and trenches formed in the dielectric layer. The resulting metallization layer is typically formed either directly on a layer carrying active devices, or on a lower lying metallization layer. A thin layer of a dielectric diffusion barrier material, such as silicon carbide or silicon nitride, is deposited between adjacent metallization layers to prevent diffusion of metal into bulk layers of dielectric. In a typical integrated circuit (IC), several metallization layers are deposited on top of each other forming a stack, in which metal-filled vias and trenches serve as IC conducting paths. The conducting paths of one metallization layer are connected to the conducting paths of an underlying or overlying layer by a series of Damascene interconnects.

Fabrication of these interconnects presents several challenges, which become more and more significant as the dimensions of IC device features continue to shrink. Currently, at the 90 nm technology node and at more advanced nodes, there is a strong need for interconnect fabrication methods that can provide interconnects with improved lifetime and reliability.

SUMMARY OF THE INVENTION

To address these needs, IC devices having interconnects with protective self aligned buffer (PSAB) layers are provided. Methods of forming capping and encapsulating PSAB layers during IC device fabrication are also described herein. Capping PSAB layers are layers of material that are selectively formed at the surface of metal layers of a partially fabricated semiconductor device. Encapsulating PSAB layers are layers of material that are formed such that the metal layer is encapsulated by the PSAB material, e.g., the PSAB layer lines the top, bottom, and side portions of metal-filled vias and trenches and resides at the interfaces between the metal and the surrounding diffusion barrier layers. Advantageously, provided methods allow formation of encapsulating PSAB layers by treating the metal-filled recesses, rather than by pre-depositing a lining material before the metal fill is formed. These methods make use of high mobility of certain PSAB materials within the metal-filled Damascene interconnects.

PSAB layers may be capable of improving several properties of Damascene interconnects. For example, a PSAB layer may promote improved adhesion between a metal layer and an adjacent dielectric diffusion barrier layer. Further, PSAB layers can protect metal surfaces from inadvertent oxidation during fabrication processes. PSAB layers, especially certain encapsulating PSAB layers can lead to a decrease in metal electromigration during end use of a semiconductor device. Methods of forming PSAB-containing interconnects having reduced stress migration parameters are also provided. Capping and encapsulating PSAB layers may comprise different PSAB materials, and, according to some embodiments, may be used in concert. For example, one interconnect can comprise both a capping and an encapsulating PSAB layer. Different combinations of PSAB materials can be used for achieving optimal interconnect performance with respect to adhesion, electromigration, and stress migration parameters.

In some embodiments, a capping PSAB layer is formed entirely within the top portion of a metal layer, such that it is substantially at the same level as the plane of a dielectric field region adjacent to the metal layer. This can be accomplished by chemically transforming exposed metal atoms to a desired material. For example, Cu can react with $SiH_4$ to form a thin capping PSAB layer of $Cu_xSi_y$ within the top portion of metal layer. In the case of an encapsulating layer, the PSAB material can also reside entirely within the metal line, without extending higher than the level of surrounding dielectric. The encapsulating PSAB layer, in addition to the portion formed at the exposed metal surface, also comprises a portion formed within an unexposed surface of the metal, e.g., at the bottoms or sidewalls of metal-filled vias and trenches. In one example, Cu reacts with $GeH_4$ to form a mobile germanium-containing material that can migrate within the metal-filled recesses and form an encapsulating PSAB layer at the top, bottom, and sidewall portions of recesses.

While the PSAB layers generally increase resistance of interconnects, such resistance shift can be efficiently controlled. In one embodiment, resistance shift can be controlled by using PSAB materials with relatively low resistivity, such as germanium-containing materials. These materials can be used either alone or in concert with other PSAB materials having higher resistivity, such as silicon-containing materials. For example, silicon-containing materials, such as $Cu_xSi_y$, $Si_xN_y$, $Si_xC_y$ can provide improved adhesion of metal layers to dielectric diffusion barrier, while germanium-containing materials can improve electromigration performance and decrease the resistance shift of an interconnect. Both materials can be used in PSAB layers having optimized performance, according to some embodiments.

Further, in some embodiments, thickness of PSAB layers, and, consequently, resistance of an interconnect can be controlled by partially passivating exposed metal surfaces, prior to formation of the PSAB layer. Such passivation can be accomplished by, for example, controllably reacting surface metal atoms with a nitrogen-containing compound (e.g., $NH_3$) to form a metal nitride. Such passivation depletes the amount of metal atoms (in a zero oxidation state) that are available for reaction to form the PSAB layer, and, consequently, controls the thickness of the PSAB layer and resistance of an interconnect.

In some embodiments, resistance of interconnects is controlled by a "pinning" operation which serves to limit the diffusion of non-conductive species into the metal line. In some embodiments, "pinning" comprises chemically transforming the exposed portion of the capping or encapsulating PSAB layer as well as transforming intermediates and by-products of PSAB forming reactions to form a thin layer of dielectric material, such as $Si_xN_y$, $Si_xC_y$, at the interface between the metal layer and a layer of dielectric diffusion barrier material. "Pinning" can also be performed on an exposed combination layer of the encapsulating and the capping PSAB layers. For example, the pinned exposed PSAB layer may comprise mixtures of $Ge_xC_y$, $Ge_xN_y$, $Si_xN_y$ and $Si_xC_y$. The described layers are referred to as "pinned PSAB layers". The dielectric material of the pinned PSAB layer may or may not have metal (e.g., Cu) dissolved within it and therefore in some embodiments could have small amount of conductivity. In some embodiments, pinned PSAB layer includes some unmodified material of the first-formed PSAB layer, such as $Cu_xSi_y$, $Cu_xGe_y$, etc.

In some embodiments, PSAB layers have a graded composition, with concentration of PSAB material gradually decreasing as the distance from the interface with the diffusion barrier increases. Thus, according to some embodiments, PSAB layers may be viewed as layers of metal impregnated with a PSAB material (e.g., with a material selected from the group consisting of $Cu_xSi_y$, $Cu_xGe_y$, $Si_xN_y$, $Si_xC_y$, $Ge_xN_y$, $Ge_xC_y$) at an interface with a dielectric diffusion barrier, where concentration of the PSAB material is gradually changing with the distance from the diffusion barrier. The encapsulating PSAB layer, located within unexposed portions of the metal line can also have graded composition. For example, concentration of germanium-containing compound can gradually decrease as the distance from a Ta diffusion barrier or from a dielectric diffusion barrier increases within a metal line.

In one aspect, a method of forming a protective layer of material on or within an exposed metal surface of a partially fabricated semiconductor device is provided. For example, the method can be practiced on a substrate having metal lines comprising a metal fill located in a Damascene region of the partially fabricated device. The substrate, in some embodiments, is received after a chemical mechanical polishing (CMP) operation and has a planarized surface.

In one operation of an embodiment of the provided method, the substrate having a pattern of exposed metal lines in a layer of dielectric is contacted with a capping PSAB reactant, such that the capping PSAB reactant reacts with metal atoms of the metal lines and chemically transforms an exposed portion of the metal into a capping PSAB layer. For example, the substrate having exposed copper lines may be contacted with a gas or a vapor selected from the group consisting of $SiH_4$, $PH_3$, $B_2H_6$, $AsH_3$, $CH_4$, $C_xH_y$, $H_2S$, $H_2Se$, $H_2Te$ or mixtures thereof. A layer comprising a material selected from the group consisting of $Cu_xSi_y$, $Cu_xP_y$, $Cu_xB_y$, $Cu_xAs_y$, $Cu_xC_y$, $Cu_xS_y$, $Cu_xSe_y$, $Cu_xTe_y$ and mixtures thereof can be formed within the exposed portion of the metal line. In particular embodiments, silicon-containing compounds, such as $SiH_4$ are used to form the $Cu_xSi_y$ capping PSAB layer. In another operation of the described method the substrate is contacted with an encapsulating PSAB reactant, such that the encapsulating PSAB reactant forms an encapsulating PSAB layer at least within the exposed and within unexposed portions of the metal lines. Germanium-containing compounds, such as $GeH_4$ can be used as encapsulating PSAB reactants. It was unexpectedly discovered that germanium-containing materials can readily migrate within metal portions of Damascene interconnects and can form encapsulating PSAB layers, in which germanium-containing material is present both at the top and at the bottom interfaces of the metal-filled vias. Such PSAB layers may contain, e.g., $Cu_xGe_y$.

In one embodiment, the formation of the capping PSAB layer is performed prior to the formation of the encapsulating PSAB layer. For example, the partially fabricated device is first treated with silane to form the capping PSAB layer, followed by germane treatment to form an encapsulating PSAB layer.

Formation of capping and encapsulating PSAB layers is typically performed without the use of plasma. Conditions are adjusted such that the PSAB layers selectively form at the metal surfaces, with no accompanying deposition or modification occurring elsewhere on the substrate. Thus, dielectric regions are typically not affected during PSAB-forming operations.

In some embodiments, the capping and encapsulating PSAB layers reside entirely within the metal layer. The thicknesses of the PSAB layers can range, for example, between 10-1000 Å. In certain embodiments, PSAB layers having a thickness ranging between about 10-60 Å can be formed in a controlled fashion.

The PSAB-forming method described above can be complemented by a number of additional operations.

In some embodiments, the substrate received after a CMP operation is pre-heated to remove organic contaminants remaining from a CMP operation. Further, in some embodiments, a plasma pre-clean is performed to remove metal oxides and other contaminants from the wafer surface. Plasma comprising a reducing gas, such as $NH_3$ or $H_2$ can be used during pre-clean.

Some embodiments include a passivation operation, performed prior to formation of the capping PSAB layer. In one embodiment, a nitrogen-containing passivating reagent, e.g., $NH_3$, contacts the partially fabricated device and interacts with an exposed metal surface to form a metal nitride, e.g., $Cu_xN_y$, at the surface of the metal layer, thereby passivating metal surface to a subsequent PSAB-forming reaction and leading to improved control over the resistance shift of the formed PSAB layers.

In some embodiments, pinning operation is performed after the formation of the capping and encapsulating PSAB layers. In a pinning operation, the substrate is contacted with a pinning reactant. The pinning reactant chemically transforms products and intermediates generated during formation of the capping and encapsulating PSAB layers into a material that does not readily diffuse into the depth of the metal layer. In some embodiments the pinning operation is performed in a plasma. Suitable pinning reactants include gases or vapors selected from the group consisting of $N_2$, $NH_3$, a hydrocarbon, a gas from the family of methyl-substituted silanes, a gas from the family of methyl-substituted amines, hexamethyldisilazane, and mixtures thereof.

In some embodiments pinning is performed by contacting the substrate with a process gas comprising a hydrocarbon in a plasma. Hydrocarbons, as used herein, are defined as compounds with $C_xH_y$ composition, which may be optionally substituted with heteroatoms, such as S, N, P, etc. Hydrocarbons, as used herein include acyclic and cyclic alkanes, alkenes, alkynes, as well as amines, mercaptans, thioethers and organic phosphines. Examples of hydrocarbons that do not include heteroatoms and that can be used as pinning reactants are methane, ethane, ethylene, acetylene, propane, propene, propyne, cyclopropane, cyclobutane, butanes, butenes, butynes, and benzene.

In some embodiments, pinning is performed by contacting the substrate with a pinning reactant concurrently with $H_2$ in a plasma.

In some embodiments, $H_2$ plasma post-treatment can be performed in lieu of the pinning operation or subsequent to pinning. Treatment of the substrate with a hydrocarbon plasma and/or with $H_2$ plasma was found to be associated with improved stress migration performance of interconnects.

Formation of the capping and encapsulating PSAB layers as well as the additional operations described above can be performed in a variety of types of apparatus. For example, different types of CVD apparatus may be employed. In some embodiments, all of the described operations are performed in the same apparatus, e.g., in a plasma enhanced chemical vapor deposition (PECVD) apparatus. In some embodiments, a multi-station apparatus is used to implement the described methods. It is also possible to perform the PSAB process in an apparatus having multiple chambers.

In some embodiments, at least two operations of those described above are performed in different stations or different chambers of a multi-station or a multi-chamber apparatus. For example formation of the capping and encapsulating layers can be performed at one station or chamber, while the pinning operation can be performed under a different temperature regime in a different station or chamber.

It is desirable that all of the operations of the PSAB process, which may include pre-heating, pre-cleaning, passivation, formation of capping and encapsulating PSAB layers, pinning, and $H_2$ plasma post-treatment are carried out in one apparatus, without exposing the substrate to ambient atmosphere containing moisture and oxygen. For example, a multi-station or a multi-chamber CVD (e.g., PECVD) apparatus may be used.

In some embodiments, process conditions for the operations of the PSAB process include temperature ranging from about 20° C. to about 500° C., pressure ranging from about 10 mTorr to 100 Torr, reactant flow rates of about 0.001 sccm-10000 sccm and reactant exposure times of about 0.5-5000 seconds.

It is understood that conditions used for particular operations of the PSAB process may differ for different operations. Each operation of the PSAB process may be performed at its own station or chamber of an apparatus providing the necessary conditions, or several operations may be performed at one station or chamber.

Typically, deposition of the diffusion barrier layer is performed after the PSAB-forming process is completed. In some embodiments, deposition of metal capping layers is performed after the PSAB-forming process is completed, but prior to deposition of a dielectric diffusion barrier. Deposition of metal caps (e.g., tungsten or cobalt caps) can be performed using metal halides and organometallic compounds as precursors, and can be carried out in the same apparatus used for the PSAB-forming process, and for the dielectric diffusion barrier deposition. For example, a multi-station or a multi-chamber PECVD apparatus may be used.

In some embodiments, deposition of a dielectric diffusion barrier layer is performed at a higher temperature than the treatment of a substrate with the capping and encapsulating PSAB reactants. Thus, in the multi-station and in multi-chamber tools these operations can be performed at different stations or chambers operating in different temperature regimes.

In another aspect, a semiconductor device having at least one interconnect is provided. The interconnect comprises a germanium-containing encapsulating PSAB layer, wherein the encapsulating layer surrounds a layer of metal, e.g., a copper line. In some embodiments, the germanium-containing layer comprises a material selected from the group consisting of $Cu_xGe_y$, $Ge_xN_y$, $Ge_xC_y$, and mixtures thereof.

In yet another aspect, an apparatus for forming a protective self aligned buffer layer within a metal layer in a partially fabricated semiconductor device is provided. The apparatus includes a process chamber having an inlet for introduction of reactants; a wafer support for holding the wafer in position during formation of the protective self aligned buffer layer; and a controller comprising program instructions for: (i) contacting the partially fabricated semiconductor device with a capping PSAB reactant, to selectively transform the top portion of the metal layer into a capping PSAB layer; and (ii) contacting the partially fabricated semiconductor device with an encapsulating PSAB reactant, to form an encapsulating PSAB layer at least within the top and bottom portions of the metal layer.

These and other features and advantages of the present invention will be described in more detail below with reference to the associated drawings.

BRIEF DESCRIPTION OF THE DRAWINGS

FIGS. 4A-4F show cross sectional depictions of device structures created during formation of a PSAB layer, according to some embodiments.

DETAILED DESCRIPTION OF PREFERRED EMBODIMENTS

Introduction and Overview

Formation of PSAB layers in interconnects will be illustrated in the context of a copper dual Damascene processing. It is understood, that methods disclosed herein can be used in other processing methods, including single Damascene processing, and can be applied to a variety of metals beyond copper. For example, these methods can be applied to gold and silver-containing interconnects.

Figure 1A:
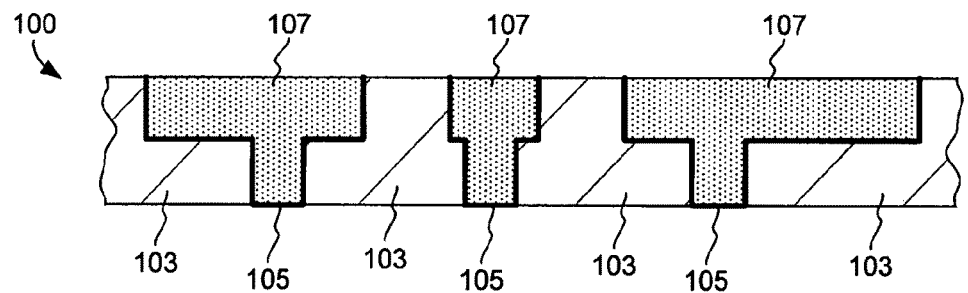
FIGS. 1A-1E show cross sectional depictions of device structures created during a copper dual Damascene fabrication process.

Presented in FIGS. 1A-1D, is a cross sectional depiction of device structures created on a semiconductor substrate at various stages of a dual Damascene fabrication process. A cross sectional depiction of a completed structure created by the dual Damascene process is shown in FIG. 1E. "Semiconductor substrate" as used in this application is not limited to the semiconductor portions of an IC device, but is broadly defined as a semiconductor-containing substrate. Referring to FIG. 1A, an example of a partially fabricated IC structure, 100, used for dual Damascene fabrication is illustrated. Structure 100, as illustrated in FIGS. 1A-1D, is part of a semiconductor substrate, and, in some embodiments, may directly reside on a layer containing active devices, such as transistors. In other embodiments, it may directly reside on a metallization layer or on other layers that incorporate conductive materials, e.g., layers containing memory capacitors.

A layer 103 illustrated in FIG. 1A is a layer of inter-metal dielectric, which may be silicon dioxide but is more typically a low-k dielectric material. In order to minimize the dielectric constant of the inter-metal dielectric stack, materials with a k value of less than about 3.5, preferably less than about 3.0 and often as low as about 2.8 are employed as inter layer dielectrics. These materials include but are not limited to fluorine or carbon doped silicon dioxide, organic-containing low-k materials and porous doped silicon dioxide materials known to those of skill in the art. Layer 103 is etched with line paths (trenches and vias) in which a partially conductive metal diffusion barrier 105 is deposited, followed by inlaying with copper conductive routes 107. Because copper or other mobile conductive material provides the conductive paths of the semiconductor substrate, the underlying silicon devices and dielectric layers proximate to metal lines must be protected from metal ions (e.g., $Cu^{2+}$) that might otherwise diffuse or drift into the silicon or inter-layer dielectric and result in degradation of their properties. Several types of metal diffusion barriers are used in order to protect the dielectric layers of the IC device. These types may be divided into partially conductive metal-containing layers such as 105 and dielectric barrier layers which will be described in further detail with reference to FIG. 1B. Suitable materials for partially conductive diffusion barrier 105 include materials, such as tantalum, tantalum nitride, titanium, titanium nitride and the like. These are typically deposited onto a dielectric layer having vias and trenches by a PVD, CVD or an ALD method.

Copper conductive routes 107 can be formed by a number of techniques, including PVD, electroplating, electroless deposition, CVD, etc. In some implementations, a preferred method of forming a copper fill includes depositing a thin seed layer of copper by PVD and subsequently depositing bulk copper fill by electroplating. Since copper is typically deposited with overburden residing in the field region, a chemical mechanical polishing (CMP) operation is needed to remove the overburden and to obtain a planarized structure 100.

Figure 1B:
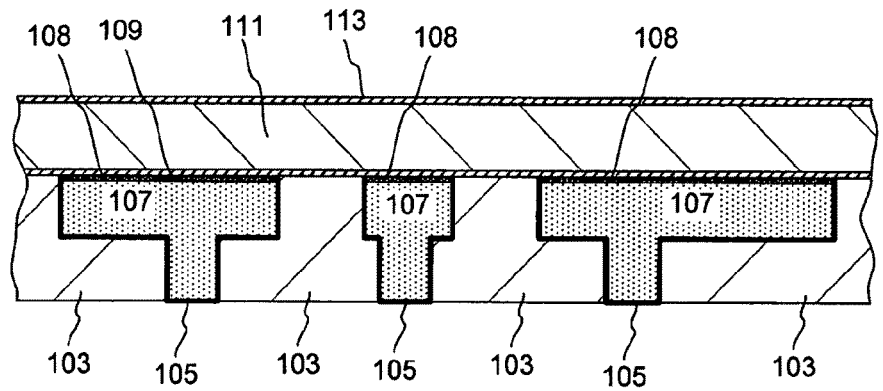

Next, referring to FIG. 1B, after the structure 100 has been completed, the surface of the substrate 100 is pre-cleaned to remove contaminants and metal oxide. After the pre-clean, capping PSAB layers 108 are formed within the top portions of metal lines 107. Capping PSAB layers are illustrated in FIGS. 1B-1E for clarity. In some embodiments, encapsulating PSAB layers may be formed in lieu of or in concert with the capping PSAB layers. Composition of capping and encapsulating PSAB layers and methods of forming them will be described in the following sections in detail. In some embodiments, CVD-deposited metal caps (not shown), such as tungsten caps, are selectively formed at the top portions of the metal lines after the PSAB layers are formed.

As depicted in FIG. 1B, a diffusion barrier film 109 is deposited on top of the PSAB layers 108 and on top of a dielectric layer 103 to encapsulate conductive routes 107. The dielectric diffusion barrier film may also serve as an etch stop during subsequent Damascene processing. In contrast to partially conductive barrier 105, film 109 should be non-conductive and should preferably have a low dielectric constant. Preferably materials with a dielectric constant of less than about 6, e.g., with a dielectric constant of lower than about 4 are used for a diffusion barrier film 109. Film 109 should also effectively prevent diffusion of metal into the dielectric layer and should provide etch selectivity when used as an etch stop. Conventionally, silicon nitride, and nitrogen-doped silicon carbide (NDC) were used for this application. Currently, materials with lower dielectric constants than silicon nitride are often used for this application. These materials include carbon-rich silicon carbide materials, such as those described in commonly assigned U.S. patent application Ser. No. 10/869,474 by Yu et al., filed on Jun. 15, 2004; boron-doped silicon carbide materials described in U.S. patent application Ser. No. 10/915,117 by Yu et al., filed on Aug. 9, 2004; in U.S. patent application Ser. No. 11/373,847 by Yu et al. filed on Mar. 8, 2006; and oxygen-doped silicon carbide materials, e.g., described in U.S. Pat. No. 6,855,645 by Tang et al. issued on Feb. 15, 2005. Further, bi-layer and tri-layer configurations can be employed for the diffusion barrier 109. Examples of suitable bi-layer and tri-layer barrier films are described, for example, in the previously cited U.S. patent application Ser. No. 10/869,474; Ser. No. 10/915,117; and in U.S. patent application Ser. No. 11/710,652 by Yu et al., filed on Feb. 22, 2007. All patent applications mentioned in this paragraph are hereby incorporated by reference for all purposes.

The diffusion barrier film can be deposited on a semiconductor substrate by a variety of CVD-type methods. For example, plasma enhanced chemical vapor deposition (PECVD) may be used. In some embodiments, PECVD having a low frequency plasma component, provided by low frequency radio-frequency (LF RF) power source, is used for diffusion barrier deposition.

Referring again to FIG. 1B, a first dielectric layer, 111, of a dual Damascene dielectric structure is deposited on a diffusion barrier 109. This is followed by deposition of an etch stop film 113 by a PECVD method on the first dielectric layer 111. The dielectric layer 111 is typically composed of low-k dielectric materials such as those listed for a dielectric layer 103. Note that layers 111 and 103 need not necessarily have identical composition. Similarly, etch stop layer 113 may or may not have an identical composition to layer 109.

Figure 1C:
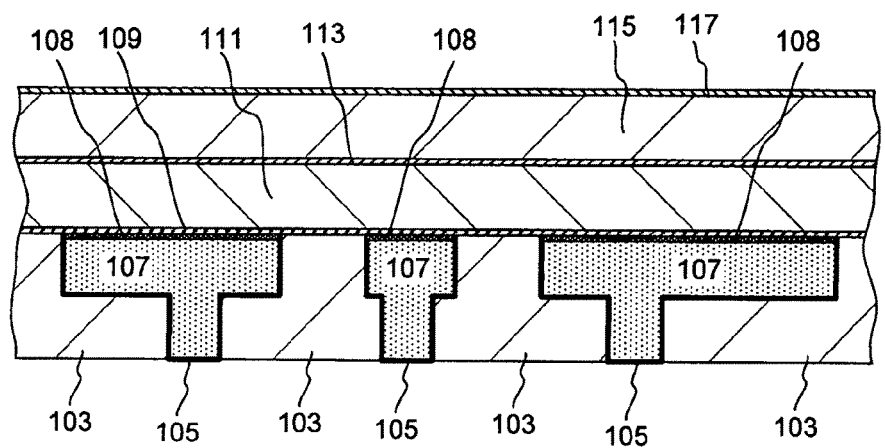

The process follows, as depicted in FIG. 1C, where a second dielectric layer 115 of the dual Damascene dielectric structure is deposited in a similar manner to the first dielectric layer 111, onto an etch-stop film 113. Deposition of an anti-reflective layer (not shown) and a CMP stop film 117 follows. Second dielectric layer 115 typically contains a low-k dielectric material such as those described above for layers 103 and 111. A CMP stop film 117 serves to protect the delicate dielectric material of inter-metal dielectric (IMD) layer 115 during subsequent CMP operations. Typically, a CMP stop layer is subject to similar integration requirements as a diffusion barrier and etch stop films 109 and 113, and can similarly be composed of materials described for layer 109.

Figure 1D:
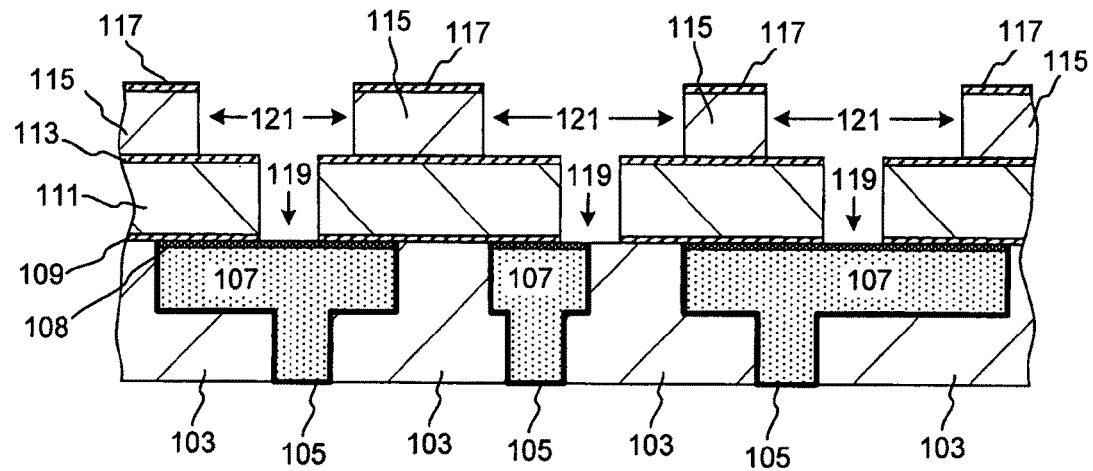
Figure 1E:
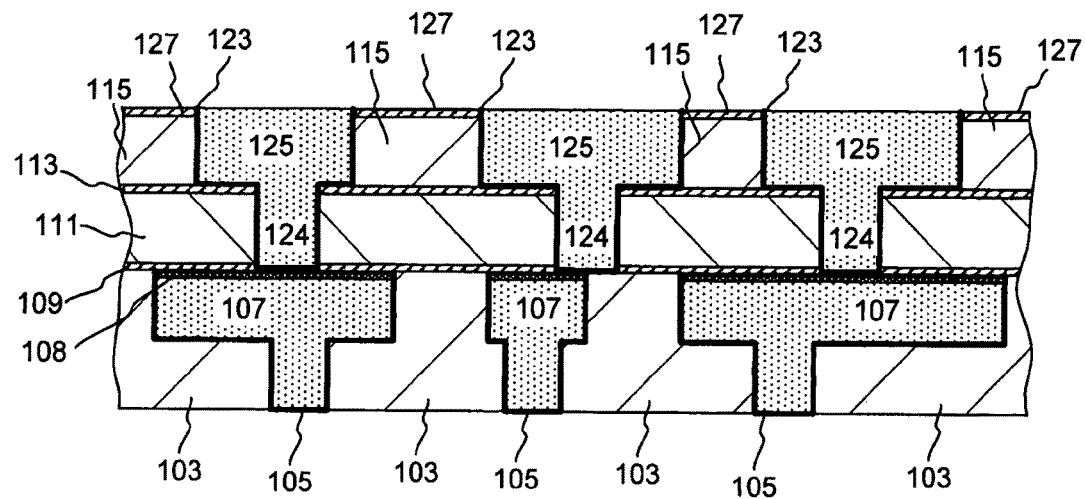

The dual Damascene process continues, as depicted in FIGS. 1D-1E, with etching of vias 119 and trenches 121 in the first and second dielectric layers. Standard lithography techniques are used to etch a pattern illustrated in FIG. 1D. A trench-first or a via-first methods well known by those of skill in the art may be employed.

Next, as depicted in FIG. 1E, these newly formed vias and trenches are, as described above, coated with a metal diffusion barrier 123, which may contain barrier materials, such as tantalum, tantalum nitride or other materials that effectively block diffusion of copper atoms into the dielectric layers.

After the diffusion barrier 123 has been deposited, a seed layer of copper is applied (typically by a PVD process) to enable subsequent electrofilling of the features with copper inlay. The copper layer is deposited by electrofill and excess metal deposited in the field is removed in a CMP operation, performed such that CMP stops at the CMP stop film 117. FIG. 1E shows the completed dual Damascene process, in which copper conductive routes 124 and 125 are inlayed (seed layer not depicted) into the via and trench surfaces over barrier 123. A PSAB layer, analogous to a PSAB layer 108 can be the formed within the top portion of the metal fill 125, and a next metallization layer may be deposited on top of the device structure shown in FIG. 1E, if needed.

FIG. 1E depicts three Damascene interconnects, in which metal layer 107 is connected with metal layer 124 of an overlying metallization layer. The role of the capping PSAB layer 108 in these interconnects will be presently described.

The PSAB layer 108 serves as a protective buffer between the metal layer 107 and a dielectric diffusion barrier layer 109. First, the PSAB layer protects the metal layer 107 from inadvertent oxidation. When no PSAB layer is formed, copper surface can be oxidized to copper oxide during inadvertent exposure to oxygen or moisture in the course of device fabrication or during end use of the device. Formation of metal oxide is typically highly undesirable since it increases resistance of interconnects, and, further, commonly leads to formation of voids in the interconnect structure. Formation of voids in the copper conductor is detrimental to the IC device and should be avoided when possible. While dielectric diffusion barriers, such as 109, protect the metal lines to some extent from moisture and/or oxygen during end use, it should be noted that not all diffusion barrier materials are sufficiently hermetic to provide such protection. Further, exposure of metal layer to atmospheric moisture and oxygen may occur during fabrication of an IC device. In some implementations, Damascene processing may require operations that involve opening of metal layer to an ambient environment containing moisture and oxygen. For example, when no PSAB layer is present, metal layer 107 is commonly exposed to atmosphere after the vias and trenches are cut in a dielectric as shown in FIG. 1 D.

Next, in some embodiments, PSAB layers can diminish electromigration at the interface between copper lines, and dielectric diffusion barrier. It has been found that this interface is the most likely point of failure during line current stress. Whereas the electromigration resistance of copper is high enough to sustain the wear-out in normally designed conductor lines, defect-induced electromigration failures have been observed at the interface between the copper and dielectric barrier layer. For instance, wherein copper oxides or hydroxides have been undesirably formed at such interfaces, voids will be formed in the copper layer, which adversely affect electromigration characteristics of such copper interconnects. Understandably, current density in these regions is considerably high during actual use, thereby causing defect-induced electromigration failure of such interconnects. PSAB layers protect metal layers from formation of defects, and thereby improve electromigration properties of interconnects.

Further, PSAB layers can provide improved adhesion between metal layers and diffusion barrier layers. Adhesion of metal to a barrier layer is an important characteristic of a copper interconnect. Poor adhesion may result in insufficient hermeticity of diffusion barrier layer and can lead to delamination of the diffusion barrier layer from an underlying metallization layer. Ultimately, such delamination may lead to failure of an interconnect. Generally, as the dielectric constant of diffusion barrier material decreases, its adhesion to an underlying metal layer becomes weaker. This is especially true for diffusion barrier materials having high content of organic residues, such as alkyl groups, carbon-carbon bonds, etc., which generally hinder adherence to metal layers. Further, referring to barrier film stress characteristics, many barrier materials having low dielectric constants, form films that are not sufficiently compressive to effect good adhesion to metal layers. With these challenges in mind, it is often desirable to use PSAB layers to strengthen adhesion between metal layers and diffusion barrier layers with low dielectric constant. In some embodiments, it may be particularly advantageous to use PSAB layers adjacent diffusion barrier layers with a dielectric constant less than about 4.0, e.g., about 3.5. In other embodiments, PSAB layers may be used adjacent dielectric barrier layers with higher dielectric constant.

In a preferred embodiment, PSAB layers are formed selectively at the exposed surface of metal layers, such that other exposed materials on the substrate surface are not affected.

Figure 2A:
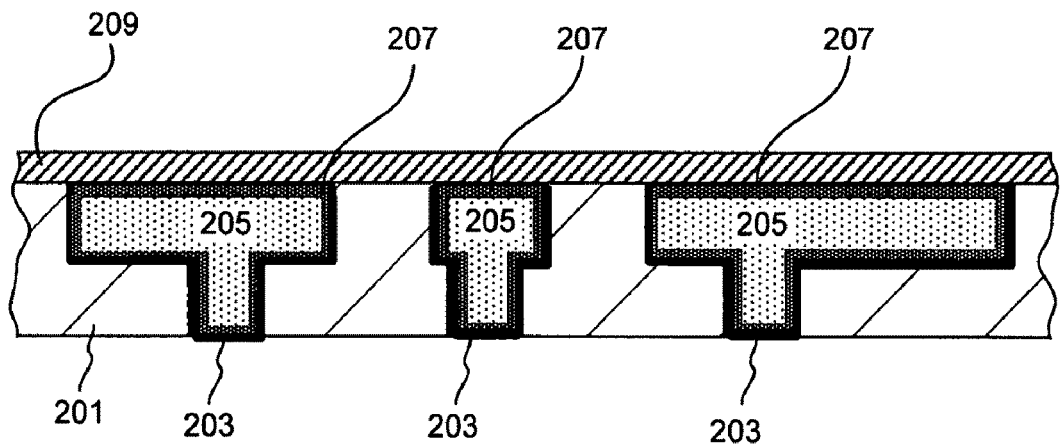
FIGS. 2A-2B show cross sectional depictions of partially fabricated device structures illustrating encapsulating PSAB layers.
Figure 2B:
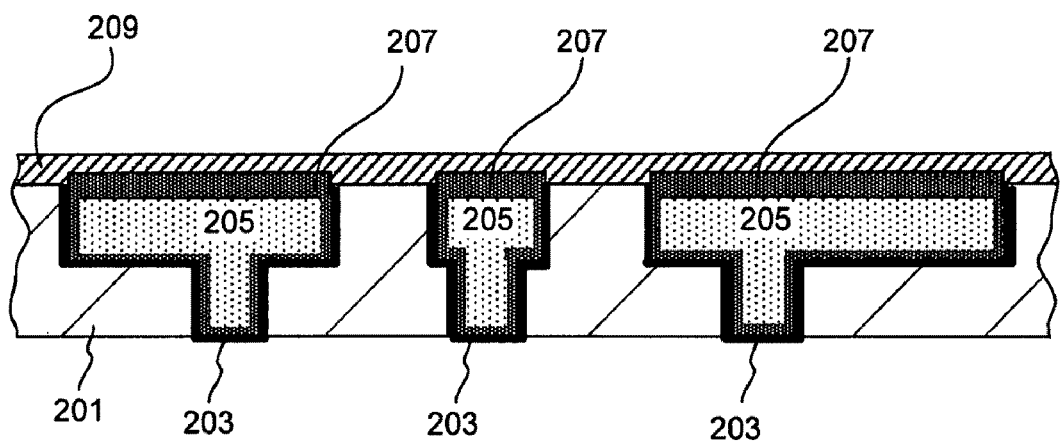

The functions of PSAB layers described above apply for capping PSAB layers illustrated in FIGS. 1B-1E as well as for encapsulating PSAB layers illustrated in FIGS. 2A-2B. It is understood, that capping and encapsulating PSAB layers having different compositions may have different functions, and, in some embodiments, both capping and encapsulating PSAB layers may be used in concert in one interconnect in order to achieve desired performance. In other embodiments, however, an interconnect may have only an encapsulating layer without having a capping layer. Alternatively, in some embodiments, only a capping layer may be sufficient, while an encapsulating layer need not be formed. Further, in some embodiments, two or more different capping PSAB materials may be formed at an exposed metal surface. One material may be tailored to improve one characteristic of an interconnect (e.g., adhesion), while another capping material is tailored to improve a different characteristic of interconnect (e.g., resistance shift). While encapsulating PSAB layers are described in particular detail in this application, combinations of different capping PSAB layers providing optimized performance, are also within the scope of present application.

Encapsulating PSAB layers will be illustrated with reference to FIGS. 2A and 2B. In some embodiments, an encapsulating PSAB layer is formed entirely within the metal layer, such that the top portion of the encapsulating PSAB layer is formed to substantially the same level as the level of inter-layer dielectric adjacent the metal layer. This embodiment is illustrated in FIG. 2A, which presents a cross-sectional depiction of a partially fabricated semiconductor device. In this device, vias and trenches formed in an inter-layer dielectric 201, are lined with diffusion barrier material 203 and are filled with metal 205. The exposed and unexposed portions of metal lines are converted to an encapsulating PSAB layer 207, and a blanket layer of dielectric diffusion barrier 209 is deposited on the substrate. Similarly to a capping PSAB layer, depicted in FIGS. 1B-1E, the encapsulating PSAB layer 207 protects the top portion of the metal layer, because it includes a portion residing at the interface between a metal 205 and a dielectric diffusion barrier 209. However, in contrast to the capping PSAB layer shown in FIGS. 1B-1E, the encapsulating PSAB layer further extends about a perimeter of the metal line, and comprises portions residing at the interfaces between metal 205 and the partially conductive diffusion barrier 203 (e.g., Ta). While the encapsulating PSAB layers can serve the same functions as the capping PSAB layers, the encapsulating layers can further improve electromigration parameters of an interconnect. The reduced electromigration of copper in interconnects that are protected with encapsulating PSAB layers, may be understood if electrical characteristics of PSAB-protected interfaces are considered. PSAB layers typically have higher resistance compared to bulk copper line. Accordingly, lower current will pass through PSAB-protected interfaces, while higher current will pass through the bulk core of copper. Therefore, the driving force for electromigration of conductive metal at the interfaces will be minimized, and interfaces of copper with both the dielectric diffusion barrier 209 and the partially conductive diffusion barrier 203 will be better protected. In an embodiment illustrated in FIG. 2A, the PSAB layer is formed such that the top portion of the encapsulating PSAB layer 207 is substantially at the same level as the dielectric layer 201. Thus, layer 207 does not extend vertically higher than the level of surrounding dielectric 201. This can be accomplished, by impregnating metal layer with PSAB material through chemical transformation of metal atoms. In some embodiments, no substantial deposition of material on top of the metal layer occurs during PSAB layer formation. In other embodiments, some material can be deposited or adsorbed on the surface of the metal layer, and later be consumed through diffusion into the metal layer and/or subsequent chemical reaction with metal atoms. Thus, in some embodiments, PSAB layer does not extend higher than about 10 Å, preferably not higher than about 5 Å above the level of dielectric 201 or in some cases does not extend even above the level of metal layer 205 prior to PSAB formation.

It was unexpectedly discovered, that certain PSAB reactants, that will be referred to as the "encapsulating PSAB reactants" can form encapsualting PSAB layers. Encapsulating PSAB layers are formed on both exposed and unexposed metal surfaces, e.g., at the top, bottom, and sidewalls of the metal-filled recesses. The exposed portion of the PSAB layer is typically formed by chemical conversion of exposed metal into a PSAB material during contact of the encapsulating PSAB reactant with the exposed metal surface. The PSAB layer at unexposed metal surfaces, such as at the bottom and sidewall portions of the metal-filled recesses, can form due to increased migration of PSAB material or due to migration of the PSAB-forming reactant within the metal interconnect.

It was unexpectedly discovered that germanium-containing materials, e.g., $Cu_xGe_y$, possess high migrating capabilities and can form encapsulating PSAB layers at temperatures of less than about 500° C., e.g., at a temperature of less than about 275° C. Formation of germanium-containing encapsulating layers typically does not require long time periods. For example, an encapsulating layer can be formed within less than about 2 seconds upon exposure to PSAB reactant at 275° C.

While in general, it is understood that other materials, such as materials containing silicon, boron, phosphorus, arsenic, carbon, sulfur, selenium and tellurium may also migrate under certain conditions to form encapsulating PSAB layers, germanium-containing materials are particularly advantageous since they do not require exceedingly high temperatures or exceedingly long migration times for formation of encapsulating PSAB layers. Further, germanium-containing materials are advantageous due to their relatively low resistivity and, consequently, due to their relatively small contribution to via resistance shift.

In some embodiments, the PSAB layer may extend higher than the layer of adjacent inter-layer dielectric. This can occur when in addition to chemical conversion of metal surface, a substantial amount of deposition onto the metal surface occurs during formation of the PSAB layer. These embodiments are illustrated by FIG. 2B, which shows a cross sectional depiction of a device, in which a PSAB layer 207 is higher than the level of dielectric 201 or the level of metal in metal line 205 prior to formation of the PSAB layer.

In both embodiments illustrated in FIG. 2A and FIG. 2B, top portion of the PSAB layer 207 may have a multi-layer structure. Top portions of layers 207 may have two or more sublayers (not shown) which may have a distinct or gradually changing composition. For example layer 207, may have a bottom sublayer predominantly composed of $Cu_xGe_y$, and a top sublayer predominantly composed of $Ge_xN_y$. In some embodiments, concentration of $Ge_xN_y$ is gradually decreasing as the distance from the dielectric diffusion barrier is increasing. Such sublayers may be formed by transforming the top portion of the first-formed PSAB layer. For example, the top portion of the PSAB layer may be modified by a transformation, effected by chemical treatment, plasma treatment, thermal treatment or some combination of these treatments. In some embodiments, the top portion of an encapsulating PSAB layer (containing, e.g., $Cu_xGe_y$) is entirely transformed to a modified PSAB layer, without forming sublayers of material. A particular chemistry and amount of such modification is tailored to a particular application for a PSAB layer. In some embodiments, chemical modification of the top portion of the PSAB layer may be necessary to control the thickness of PSAB layer. Further, in some embodiments, it may be advantageous to transform the top portion of the PSAB layer to a material that provides optimal adhesion with a dielectric diffusion barrier. The discussion provided above referred to a germanium-containing encapsulating layer. In other embodiments, as will be illustrated in the following sections, the portion of the encapsulating layer residing at an interface with a dielectric diffusion barrier may have a mixed composition with capping PSAB materials. For example, in addition to germanium-containing materials described above, it may contain a material selected from the group consisting of $Cu_xSi_y$, $Cu_xP_y$, $Cu_xB_y$, $Cu_xAs_y$, $Cu_xCY$, $Cu_xS_y$, $Cu_xTe_y$, $Cu_xSe_y$, $Si_xN_y$, $Si_xC_y$, and C. For example, in some embodiments, a capping PSAB layer (not shown) may be formed prior to, concurrently with, or after formation of the encapsulating PSAB layer. In these embodiments, the PSAB layer at the interface between the copper line and the dielectric diffusion barrier may have a mixed or a multi-layer composition. When the capping PSAB layer comprises silicon, and the encapsulating PSAB layer comprises germanium, the layer formed at the exposed metal surface may include, for example, mixtures of at least one compound selected from the group consisting of $Cu_xSi_y$, $Si_xN_y$, and $Si_xC_y$, with at least one compound selected from the group consisting of $Cu_xGe_y$, $Ge_xN_y$, and $Ge_xC_y$.

As mentioned, in certain embodiments, the PSAB layers have a graded composition. The PSAB layer may be viewed as an alloy of copper metal with PSAB material, or as a layer of copper impregnated with PSAB material at an interface with a diffusion barrier layer. The concentration of elemental copper in these embodiments is gradually decreasing towards the interface with the diffusion barrier layer, while concentration of PSAB material is increasing. Such structure is particularly advantageous for improvement of adhesion between metal and dielectic layers, as gradual change in material properties leads to good binding between the two layers. While in some embodiments, PSAB layers are graded, in other embodiments PSAB layers may be distinct rather than blended into the underlying metal layers, and may have an abrupt boundary with the metal layer.

While PSAB layers provide numerous advantages to interconnect structure and performance, fabrication of PSAB-containing interconnects having good adhesion, electromigration, stress migration and resistance shift parameters, can be challenging. These challenges, are addressed, in some embodiments, by providing PSAB-forming methods that make use of capping PSAB layers and encapsulating PSAB layers used in concert. More generally, different PSAB materials having different properties, can be used in concert, regardless of whether they form capping or encapsulating layers. In particular embodiments, silicon-containing capping PSAB layers can provide improved adhesion, while germanium-containing encapsualting PSAB layers can provide improved resistance shift and electromigartion performance to an interconnect. Using such layers in concert can provide interconnects with optimized performance.

Methods of Forming PSAB Layers

Methods of forming capping PSAB layers, encapsulating PSAB layers and combinations of capping and encapsulating PSAB layers are provided. Methods of forming capping PSAB layers have been described in detail in U.S. patent application Ser. No. 11/709,293, which was previously incorporated by reference. Methods of forming encapsulating PSAB layers and combinations of capping and encapsulating PSAB layers will be presently discussed.

As previously discussed, an encapsulating PSAB layer can be formed by contacting a semiconductor substrate having a pattern of exposed metal lines in a dielectric with an encapsulating PSAB reactant. Encapsulating PSAB reactant does not only transform the exposed portion of the metal layer to a PSAB material, but also leads to formation of the PSAB layer within unexposed portions of metal, preferably encapsulating the metal layer, as illustrated in FIG. 2A. Preferably, PSAB material is not substantially present within the bulk portion of the metal, but predominantly concentrates at the interfaces of metal with other materials, such as at the interfaces with diffusion barrier layers. While in some embodiments, it is preferred that the encapsulating PSAB material resides at all interfaces of the metal, it is understood that in some embodiments the encapsulating PSAB layer may be discontinuous or may have variable thickness at different interfaces. For example, the encapsulating PSAB layer may be absent or may have lower thickness at the sidewall interface of the metal-filled line. Generally, encapsulating PSAB layer has at least one portion residing at an unexposed interface of the metal line, e.g. at the bottom of the metal-filled via.

Formation of the encapsulating PSAB layers was unexpectedly discovered when partially fabricated devices having exposed metal lines were treated with $GeH_4$. When the substrate containing exposed portions of metal and dielectric is contacted with germane in the absence of plasma, the metal surface is selectively transformed to a germanium-containing material, while the dielectric regions remain unaffected by this treatment. Germanium-containing material was also found to be residing at the bottom and, possibly, at the sidewall portions of the metal-filled recesses, thereby forming an encapsulating PSAB layer. Without being bound by a particular theory, this behavior can be explained by high mobility of germanium-containing material within an interconnect. For example, a germanium-containing material, such as elemental germanium or copper germanide may flow from the exposed portion of the metal surface, where it is formed, to unexposed portions of the metal. Remarkably, germanium-containing material concentrates at the interfaces between metal and diffusion barrier layers, and is typically not present at a significant concentration within the bulk portion of metal line. Germanium-containing material can form encapsulating PSAB layers at temperatures of less than about 500° C. and within a period of time of less than about 2 seconds upon $GeH_4$ exposure. In an alternative mechanism, formation of encapsulating layer can be explained by migration of $GeH_4$ itself through the metal—diffusion barrier interfaces within an interconnect. As discussed in the previous sections, use of germanium-containing encapsulating layers can improve resistance shift due to relatively low resistivity of germanium-containing materials. Further, electromigration performance of interconnects can be improved.

While encapsulating PSAB layers will be primarily illustrated herein using germanium-containing layers as an example, it is understood that conditions may be found for other materials to achieve same levels of drifting capability. For example, modulation of temperature and time allowed for migration, may lead to formation of encapsulating layers with other types of materials. For example, the substrate may be contacted with a gas or a vapor, selected from the group consisting of $SiH_4$, $PH_3$, $B_2H_6$, $AsH_3$, an alkane, $H_2S$, $H_2Se$, and $H_2Te$. Further, a variety of metal hydrides and alkylated element hydrides can be used. Examples include $SnH_3$, $SbH_3$, plumbane, etc. In some embodiments, metal halides (fluorides, chlorides, bromides or iodides) can be used for forming PSAB layers. For example, in some embodiments, molybdenum halides are used. In these cases, inter-metal compounds and alloys (e.g. $Cu_xMo_y$) are formed as the PSAB layers. In general, a variety of metal hydrides and/or halides or alkyl substituted hydrides and/or halides which could be delivered into a CVD chamber in their gaseous forms could be employed as PSAB forming reactant. Further, in some embodiments, a variety of metal containing compounds (including organometallics) that could be delivered into the CVD chamber in its gaseous form could be used as PSAB forming reactants. Examples include alkyl, carbonyl, and cyclopentadienyl-substituted organometallic compounds, such as tetrakisdimethylaminotitanium, cyclopentadieneyl molybdenum, nickel tetracarbonyl and iron pentacarbonyl. Typically, such compounds would impregnate top portions of copper lines with thin layers of metals, e.g., Ti, Mo, Ni, Fe and the like to form alloys with copper. The conditions can be further adjusted, such that an encapsulating rather than a capping layer would form. For example temperatures and times allowed for migration of PSAB material can be modulated to achieve increased migration of the PSAB material. Thus encapsulating PSAB layers containing Si, P, B, As, C, S, Se, or Te may be formed. In some embodiments, metal-containing encapsulating PSAB layers may be formed, e.g. Sn, Sb, Pb, Mo, Fe, Ni, or W-containing encapsulating PSAB layers might form.

Whether a particular PSAB reactant will form a capping or an encapsulating PSAB layer, may depend on the chemistry of the reactant, the temperature used to allow for migration of PSAB material, and the time allowed for such migration. For example, depending on temperature and migration times, reactants described above in the context of forming an encapsulating PSAB layer, can be used for forming a capping layer. For example, the same PSAB reactant may form a capping PSAB layer at lower temperature, and an encapsulating PSAB layer at higher temperature.

However, when referring to a particular temperature regime, each PSAB reactant can be characterized as a capping PSAB reactant or as an encapsulating PSAB reactant. For example, in the temperature range of about 200-400° C., silane is characterized as a capping PSAB reactant, while germane is characterized as an encapsulating PSAB reactant. This can be explained by greater mobility of elemental germanium or other germanium-containing compound around the periphery of an interconnect, compared to elemental silicon or other silicon-containing compound, formed at the exposed surface of the metal.

Several embodiments of processes that involve formation of encapsulating and capping PSAB layers will be illustrated with reference to process flow diagrams presented in FIGS. 3A-3B and cross-sectional device structures shown in FIGS. 4A-4F. It is understood that provided methods are not limited to particular process flows illustrated in the process diagrams, and a variety of combinations of operations may be performed. For example, while processes used in these illustrations describe forming a capping PSAB layer followed by forming an encapsulating PSAB layer, it is understood that in alternative embodiments the encapsulating PSAB layer may be formed prior to or concurrently with the capping PSAB layer formation. In some embodiments formation of the capping layer may be skipped, in other embodiments formation of an encapsulating PSAB layer may be skipped.

Figure 3A:
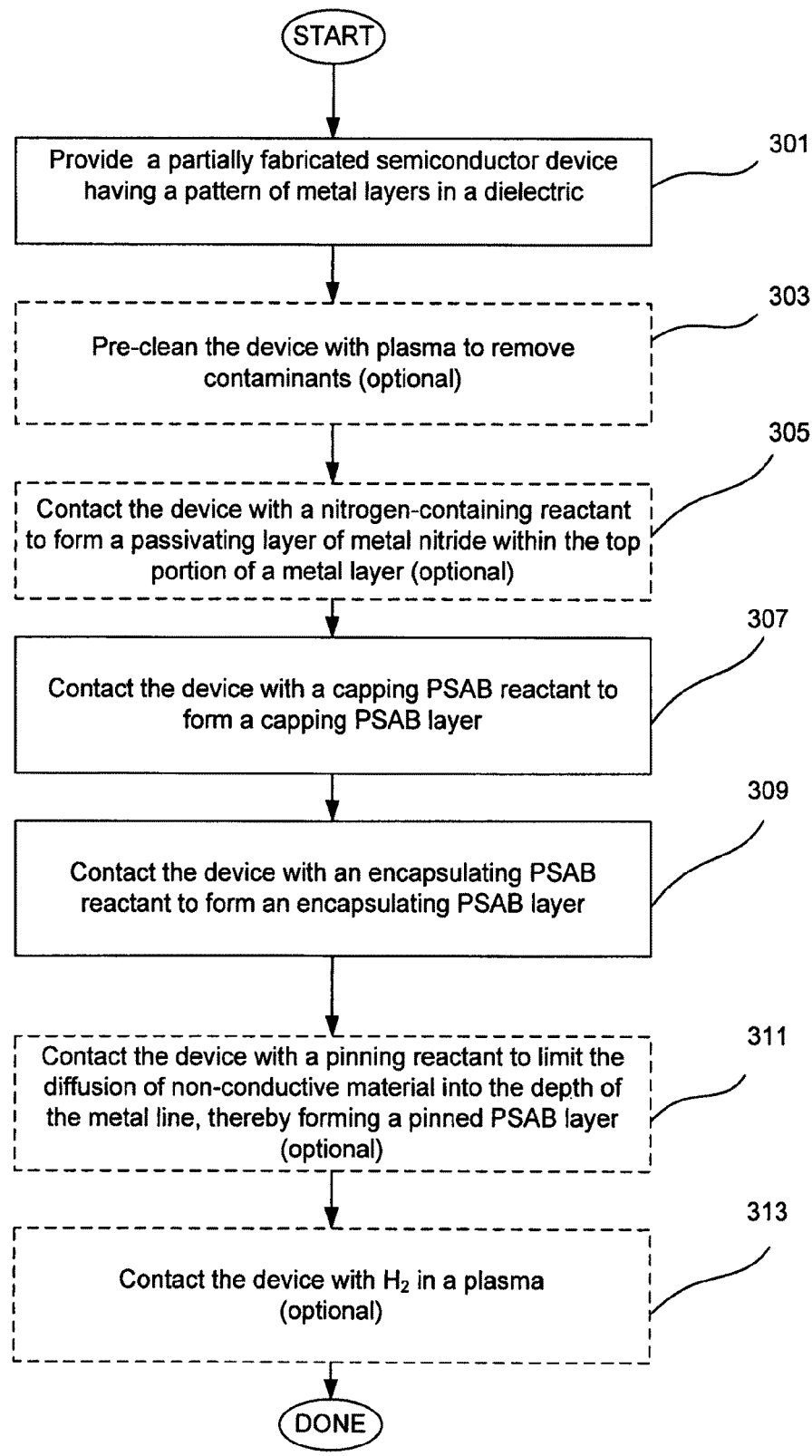
FIGS. 3A-3B present example process flow diagrams of a PSAB-forming process according to some embodiments provided herein.

Referring to FIG. 3A, the process starts by providing a partially fabricated semiconductor device having a pattern of exposed metal layers in a dielectric, as shown in process block 301. The substrate is provided after the vias and trenches have been filled with metal and excess metal has been removed by CMP. Examples of such substrate are illustrated in FIG. 1A and in FIG. 4A. In FIG. 4A, a via and a trench formed in an inter-layer dielectric 401 are lined with a diffusion barrier 403, and are filled with a metal fill 405. The substrate is planarized by CMP prior to formation of the PSAB layer.

In some embodiments, the entire process shown in FIG. 3A is performed in a vacuum environment, without breaking the vacuum or exposing the partially fabricated device to an ambient atmosphere during or between the operations shown in FIG. 3A. In some embodiments, the entire process depicted in FIG. 3A is performed in one apparatus. Further, in some embodiments, the entire process depicted in FIG. 3A can be performed at one station of a multi-station apparatus. In some embodiments, two or more operations of the process shown in FIG. 3A are performed at different stations of a multi-station apparatus or in different chambers of a multi-chamber apparatus. For example, in some embodiments, $H_2$ plasma post-treatment shown in process block 313 may be performed at a different station than the station used for operations 301-311, because, a different temperature may be required in order to optimize the impact of the $H_2$ post treatment process. In some embodiments, pinning operation 311 may be performed in station or a chamber that is different from stations or chambers used for operations 301-309. Generally, the process shown in FIG. 3A can be performed at a temperature ranging from about 20° C. to 500° C., and at a pressure ranging from about 10 mTorr to about 100 Torr. The flow rates of reactants in the process can range from about 0.001 sccm to about 10000 sccm (per process chamber housing four 300 mm wafers), and reactant contact times can range from about 0.5 to about 50000 seconds, e.g. from about 0.5 to about 5000 seconds.

PSAB layers can be formed in any apparatus that provides mechanisms for reagent flow and a process chamber that can effectively isolate the fabricated device from moisture and oxygen of ambient environment. Preferably the apparatus should be capable of providing vacuum environment and a temperature that is necessary to perform the PSAB-forming reaction. For example, various types of CVD tools can be used for PSAB layer formation. In some embodiments, the PSAB-forming process may include operations that require plasma treatment, or plasma-enhanced reactions. Therefore, in some embodiments it is preferable to use PECVD tools, such as SEQUEL™ and VECTOR™ PECVD tools available from Novellus Systems, Inc. (San Jose, Calif.). Further, in some embodiments, a dual frequency PECVD apparatus that has high frequency (HF) and low frequency (LF) radio frequency (RF) plasma sources, is preferred. Low frequency RF power refers to RF power having a frequency between 100 kHz and 2 MHz. A typical frequency range for LF plasma source is between about 100 kHz to 500 kHz, e.g., 400 kHz frequency may be used. High frequency power refers to RF power with a frequency greater than 2 MHz. Typically HF RF frequency lies in the range of between about 2 MHz-30 MHz. A commonly used HF RF values include 13.56 MHz and 27 MHz. In some embodiments LF power ranging from about 0 W/cm² to 1.0 W/cm², and HF power ranging from 0.1-1.5 W/cm² can be used in plasma assisted operations, such as during pre-clean, pinning and $H_2$ post-treatment. In some embodiments a single frequency process is used in plasma-assisted operations.

Referring again to FIG. 3A, the substrate provided to a process chamber is pre-heated and is optionally pre-cleaned as shown by the process block 303. Pre-cleaning and pre-heating operations remove contaminants from the surface of the wafer. In particular, pre-heating can remove organic contaminants while plasma pre-cleaning can remove metal oxide from the metal surface, thereby exposing metal atoms for subsequent reactions. It is desirable to perform pre-cleaning after a CMP operation or any exposure to moisture and oxygen, since CMP can leave a significant amount of contaminants on a wafer surface. Pre-clean operation can be accomplished by, for example, exposing the surface of a substrate to a plasma containing a reducing gas, such as $NH_3$ or $H_2$. In some embodiments pre-clean with $H_2$ plasma has provided devices with particularly improved characteristics. The process gas during pre-clean can also include a carrier gas, such as $N_2$, He, Ar, etc. In one example, pre-clean is performed in a PECVD chamber at a temperature of about 200-400° C., pressure of about 1.5-4 Torr and an $H_2$ flow rate of about 4000-10000 sccm. The plasma, which may contain an HF and an LF component is ignited and is sustained at a total power of 200-1000 W per one 300 mm wafer. In some embodiments, it is preferable to use HF power at 0.1-1.5 W/cm² and LF power at 0-0.8 W/cm² during the pre-clean operation. In another example, $NH_3$ is used instead of $H_2$ as a reducing gas, and is flowed into the process chamber at a flow rate ranging from about 6000 to 8000 sccm. An $N_2$ carrier gas is flowed into the chamber at a flow rate of about 2000-4000 sccm. The pre-cleaning treatment can last several seconds, e.g., between about 6-20 seconds.

After the contaminants and metal oxides are removed from the surface of the substrate, the substrate is optionally contacted with a passivating reagent. This operation typically serves to reduce the resistance shift in subsequently formed interconnects, and may be used in some embodiments, particularly in those embodiments where PSAB materials having high resistivity are formed within the metal layer. In some embodiments, the passivating reagent is a nitrogen-containing reagent that is capable of forming metal nitride, e.g., $Cu_xN_y$ at the surface of the metal layer, as shown in the process block 305. In a particular embodiment, nitrogen-containing reagent is $NH_3$. Generally, a variety of nitrogen-containing compounds can be used. These include hydrazine ($N_2H_4$) and amines (e.g., methylamine, ethylamine, diethylamine, etc.). In some embodiments halogens or halogen-containing compounds may be used as passivating agents, partially converting metal surface to metal halides. For example, $I_2$ can be used. In other embodiments certain hydrocarbons may be used as passivators, partially converting the metal surface to metal carbide. The passivating reagent is preferably selected such that it can modify metal surface without the use of plasma. In one embodiment, the passivating reagent is introduced in a controlled fashion, such that the metal surface is not entirely converted to passivated material, but still contains unpassivated metal atoms, which can be converted to a PSAB material during subsequent PSAB forming operation. A substrate having a partially passivated surface is illustrated in FIG. 4B. In this example metal nitride 407 is formed within an upper portion of metal layer 405. Metal nitride 407 occupies only a fraction of exposed surface, with a certain amount of metal 405 being available to subsequent transformations. The degree of passivation of the metal surface, can be controlled by parameters of the passivating process, such as nature of the passivating reagent, temperature, flow rate of passivating reagent and contact time of reagent with the metal layer.

In one embodiment, copper surface is partially converted to $Cu_xN_y$ by flowing $NH_3$ into a process chamber at a flow rate of about 6000-8000 sccm, at a pressure of about 1.5-4 Torr and at a temperature of about 200° C.-400° C. In this embodiment, plasma is not ignited during the passivation process. In other embodiments, passivation may be plasma-assisted. In some embodiments $NH_3$ is the only gas that is flowed into the chamber during passivation operation. In other embodiments, $NH_3$ or other passivating reagent may be diluted by a carrier gas, such as $N_2$, $H_2$, He, Ar, etc. The metal layer is contacted with the passivating reagent for a controlled period of time that provides the desired amount of passivated material at the metal surface. For example, the substrate can be treated with $NH_3$ for about 2-4 seconds to convert a desired fraction of copper surface to copper nitride.

In one embodiment, the passivating operation selectively transforms metal surface without affecting other exposed surfaces of the substrate. For example, passivating operation 305 in this embodiment does not transform the dielectric layer and does not deposit any material on a layer of dielectric.

Referring again to FIG. 3A, the PSAB process follows by forming a capping PSAB layer within the top portion of the metal layer. As shown in the process block 307, the partially fabricated device is contacted with a capping PSAB reactant to form a capping PSAB layer. The capping PSAB reactant reacts with the available metal atoms of the metal layer, but preferably does not affect materials elsewhere on the wafer.

In some embodiments the capping PSAB reactant comprises a gas or a vapor, selected from the group consisting of $SiH_4$, $PH_3$, $B_2H_6$, $AsH_3$, an alkane, $H_2S$, $H_2Se$, and $H_2Te$. Further, a variety of metal hydrides and alkylated element hydrides can be used. Examples include $SnH_3$, $SbH_3$, plumbane, etc. In some embodiments, metal halides (fluorides, chlorides, bromides or iodides) are used for forming PSAB layers. For example, in some embodiments, molybdenum halides are used. In these cases, inter-metal compounds and alloys (e.g. $Cu_xMo_y$) are formed as first PSAB layers. In general, a variety of metal hydrides and/or halides or alkyl substituted hydrides and/or halides which could be delivered into a CVD chamber in their gaseous forms could be employed as PSAB forming reactant. Further, in some embodiments, a variety of metal containing compounds (including organometallics) that could be delivered into the CVD chamber in its gaseous form could be used as PSAB forming reactants. Examples include alkyl, carbonyl, and cyclopentadienyl-substituted organometallic compounds, such as tetrakisdimethylaminotitanium, cyclopentadieneyl molybdenum compounds, nickel tetracarbonyl and iron pentacarbonyl. Typically, such compounds would impregnate top portions of copper lines with thin layers of metals, e.g., Ti, Mo, Ni, Fe and the like to form alloys with copper.

The capping PSAB reactant contacts the semiconductor substrate under such conditions that top portion of the metal is converted to a capping PSAB layer, comprising a material selected from the group consisting of $M_xSi_y$, $M_xP_y$, $M_xB_y$, $M_xAs_y$, $M_xC_y$, $M_xS_y$, $M_xSe_y$, and $M_xTe_y$, where M is metal, when $SiH_4$, $PH_3$, $B_2H_6$, $AsH_3$, an alkane, $H_2S$, $H_2Se$, and $H_2Te$ reactants are used. For example a layer comprising $Cu_xSi_y$, $Cu_xP_y$, $Cu_xB_y$, $Cu_xAs_y$, $Cu_xC_y$, $Cu_xS_y$, $Cu_xSe_y$, or $Cu_xTe_y$ is formed. While in some embodiments formation of the capping PSAB layer may be plasma-assisted, in many embodiments, including an embodiment in which $SiH_4$ contacts Cu to form $Cu_xSi_y$, plasma is preferably not ignited during formation of the first PSAB layer. When plasma is not applied, silane selectively reacts with metal surface, without depositing any material on other exposed surfaces of the wafer. For many PSAB forming reagents plasma should not be ignited during PSAB forming process, in order to achieve selective formation of PSAB layer within the metal surface, rather than blanket deposition of material across the wafer. In some embodiments, the capping PSAB reactant is selected such that it would form a PSAB material that would maximize adhesion between copper and the dielectric diffusion barrier layer. Examples of such materials include silicon-containing materials. Thus, in one embodiment the capping PSAB layer is formed by treating the substrate with a silicon containing reactant, such as $SiH_4$, $Si_2H_6$, a substituted silane (e.g., $RSiH_3$, $R_2SiH_2$, $R_3SiH$, wherein R is an alkyl, alkenyl or alkynyl, which may be further substituted with heteroatoms) to selectively convert the exposed surface of the metal to metal silicide. Metal silicide can be further converted to materials having an excellent adhesion to a diffusion barrier layer, as will be illustrated.

In some embodiments, the first PSAB layer is formed entirely within the top portion of the metal line. Such embodiment is illustrated in FIG. 4C, where the capping PSAB layer 409 is self-aligned with the metal layer 405 and does not extend higher than the layer of surrounding dielectric 401. Layer 409 comprises, in one embodiment, metal silicide and, in some embodiments, metal nitride remaining from the passivating treatment (not shown). Layer 409 can also include metal (in zero oxidation state), which is impregnated with the above-mentioned materials.

In a particular example, the capping PSAB layer is formed by flowing $SiH_4$ into a process chamber at a flow rate of about 100-1000 sccm. $NH_3$ at a flow rate of about 4000-10000 sccm or $H_2$ at a flow rate of about 4000-10000 sccm can be optionally flowed into the process chamber concurrently with silane. The $SiH_4$ treatment lasts for about 1-6 seconds at a temperature ranging from about 200-400° C. and pressure ranging from about 1.5-4 Torr. In some embodiments, it is preferable to keep the temperature lower than 300° C. in order to limit diffusion of nonconductive species into the metal line. In other embodiments, temperatures higher than 300° C. are used while diffusion of nonconductive species and via resistance are controlled using other methods (e.g., passivation and pinning). No plasma is applied in this embodiment, and $SiH_4$ selectively reacts only with the metal surface to form a copper silicide containing PSAB first layer In an alternative embodiment, the capping PSAB layer may be formed by treating the substrate with a surface active reagent that selectively adsorbs on a metal surface. This embodiment is described in detail in U.S. application Ser. No. 10/980,076, which was previously incorporated by reference.

After the capping layer has been formed, the process follows by contacting the device with an encapsulating PSAB reactant to form an encapsulating PSAB layer in an operation 309. Examples of encapsulating PSAB reactants have been listed above. In some embodiments, encapsulating PSAB reactants are selected such that the encapsulating PSAB material would have relatively low resistivity and will have low contribution to the resistance shift of a via. In some embodiments, the substrate is treated with a germanium-containing reactant, such as $GeH_4$ or $Ge_2H_6$, to form an encapsulating PSAB layer.

In a particular example, the encapsulating PSAB layer is formed by flowing $GeH_4$ into a process chamber at a flow rate of about 10-1000 sccm. $NH_3$ at a flow rate of about 4000-10000 sccm or $H_2$ at a flow rate of about 4000-10000 sccm, and $N_2$ at a flow rate of about 0-18000 sccm can be optionally flowed into the process chamber concurrently with germane. The germane treatment lasts for about 1-6 seconds at a temperature ranging from about 200-400° C. and pressure ranging from about 1.5-4 Torr. No plasma is applied in this embodiment. Germane selectively reacts with the metal surface and presumably generates a fast-migrating germanium-containing product, e.g., elemental germanium, which flows within the copper line and concentrates at the interfaces of copper with diffusion barrier materials. Alternatively, the germanium precursor itself may migrate around the interfacial regions prior to reacting. The encapsulating PSAB layer may also contain $Cu_xGe_y$ compound. The structure resulting from operations 301-309 is illustrated in FIG. 4D. The encapsulating PSAB layer 413 surrounds the metal line 405, and resides at the interfaces of copper line with the diffusion barrier 403, as well as at the exposed surface of the metal line. Note, that the PSAB layer 411 which resides at the surface of the metal line comprises both a previously deposited capping PSAB material and the encapsulating PSAB material. The previously deposited capping layer may, in some embodiments, be chemically modified by the treatment with the encapsulating reactant. Regardless, the layer 411, in this embodiment, has a different composition from the PSAB layers residing within the unexposed portions of metal. For example, the layer 411, may include both silicon-containing material and a germanium containing material (e.g., $Cu_xSi_y$ and $Cu_xGe_y$), while the unexposed bottom and sidewall portions of metal layer 405 may include only germanium containing material, e.g., $Cu_xGe_y$.

In some embodiments, a "pinning" operation is optionally performed to limit the diffusion of non-conductive materials into the metal line. Pinning is particularly important, when materials with relatively low conductivity, such as silicon-containing materials are used. As shown in the process block 311 of FIG. 3A, the pinned PSAB layer is formed by contacting the device substrate with a pinning reactant. In general, pinning can be accomplished by thermal treatment, plasma treatment, chemical treatment, or some combination of the three. In one embodiment, pinning is performed by contacting the substrate with a pinning reagent selected from the group consisting of $N_2$, $NH_3$, a hydrocarbon, a gas from the family of methyl-substituted amines, and mixtures thereof. In some embodiments silicon-containing pinning reagents, such as a gas from the family of methyl-substituted silanes or HMDS may be used. Preferably, modification of the first PSAB layer with the pinning reagent is performed with plasma treatment. In one embodiment, the exposed PSAB layer containing $Cu_xSi_y$ and $Cu_xGe_y$ is treated with $NH_3$ in a plasma. Under conditions practiced in this embodiment, excess of elemental silicon residing within and/or on the surface of metal line is transformed into silicon nitride, which does not readily diffuse into the bulk of metal layer. Further, under conditions of such pinning, $Cu_xSi_y$ and $Cu_xGe_y$ are partially or completely transformed to copper metal (at zero oxidation state) impregnated with silicon nitride and germanium nitride, thereby forming an excellent adhesive layer at the interface of metal fill and a dielectric diffusion barrier.

In a particular example, a substrate having an exposed PSAB layer comprising $Cu_xSi_y$ and $Cu_xGe_y$ is treated with $NH_3$ and $N_2$ in a plasma generated using HF and LF power sources. $NH_3$ is introduced into a process chamber at a flow rate of about 6000-8000 sccm. $N_2$ is flowed into the chamber at a flow rate of about 2000-4000 sccm. The substrate is treated at a temperature of about 200-400° C., and pressure of about 1.5-4 Torr for a period of time ranging from about 3 to 20 seconds. Plasma is ignited using HF and LF power sources at a total power level of about 200-1000 W for one 300 mm wafer. As a result, a pinned PSAB layer containing $Si_xN_y$ and $Ge_xN_y$ is formed.

The device resulting after the pinning process is illustrated in FIG. 4E. The exposed PSAB layer 411 has been transformed by the pinning process to a layer with a different composition 415, while the unexposed portions of the encapsulating PSAB layer 413 were not affected by the pinning. The exposed layer 415 may contain, for example, $Si_xN_y$, $Si_xC_y$, $Ge_xC_y$, $Ge_xN_y$, $Cu_xSi_y$, $Cu_xGe_y$, and mixtures thereof. In some embodiments copper metal is impregnated with these materials, and layers having a graded composition are formed. In other embodiments, distinct bi-layers or tri-layers may form after pinning.

In some embodiments, (including embodiments employing hydrocarbon and silicon containing pinning reagents) pinning conditions are preferably selected such that only the exposed PSAB layer is transformed, while no substantial deposition occurs elsewhere on the wafer, e.g., on a dielectric field. Preferably, in these embodiments no more than 10 Å of material is deposited elsewhere on the dielectric field regions of the wafer.

Depending on a reagent that is used in pinning, the pinned PSAB layer may contain $Si_xN_y$, $Si_xC_y$, hydrogen-doped carbon or a combination of these materials. For example, treatment with hydrocarbons will result in $Si_xC_y$ or C:H-containing pinned PSAB layer, while treatment with $NH_3$ and $N_2$ will result in $Si_xN_y$ containing pinned PSAB layer. Germanium-containing exposed layers can also be pinned to form, e.g., $Ge_xN_y$, and $Ge_xC_y$.

In some cases, pinning using hydrocarbons was found to be associated with improvement in stress migration parameters of interconnects. Hydrocarbons, as used herein, are defined as compounds with $C_xH_y$ composition, which may be optionally substituted with heteroatoms, such as S, N, P, etc. Hydrocarbons include acyclic and cyclic alkanes, alkenes, alkynes, as well as amines, mercaptans, thioethers and organic phosphines. Examples of hydrocarbons that do not include heteroatoms and that can be used as pinning reactants are methane, ethane, ethylene, acetylene, propane, propene, propyne, cyclopropane, cyclobutane, butanes, butenes, butynes, and benzene.

Pinning with hydrocarbons results in chemical transformation of the exposed PSAB layer leading to a structure with slower migration of vacancies in a via.

In some embodiments, pinning is performed exclusively with hydrocarbons in a plasma without $NH_3$, $N_2$ and other pinning reagents. In other embodiments, mixtures of pinning reagents (e.g., $NH_3$, $N_2$) with a hydrocarbon may be used during plasma-assisted pinning. Hydrocarbon content in the process gas can range from about 0.0001% (trace values) to 100%, preferably from about 1% to 100% by volume. Pressure, temperature, and plasma conditions for hydrocarbon pinning can be similar to those described above for $NH_3$ pinning. In one embodiment the exposed PSAB layer is treated with a mixture of $NH_3$ (or $N_2$) flowed into the process chamber at the flow rate range of between about 500 sccm to 5000 sccm and cyclopropane flowed in the range of 2.5 sccm to 5000 sccm per one 300 mm wafer using a plasma. When such treatment is performed on $Cu_xSi_y$-containing PSAB layer, a $Si_xC_yN_z$ material is typically formed.

In another embodiment a hydrocarbon is flowed into the process chamber without being mixed with other pinning reagents. For example, cyclopropane can be flowed into the chamber at a flow rate ranging from about 2.5 to 5000 sccm per one 300 mm wafer. The plasma is then ignited under similar conditions or under slightly modified conditions, as described for $NH_3$ pinning and the exposed PSAB layer is modified by hydrocarbon pinning. When such treatment is performed on $Cu_xSi_y$ PSAB layer containing a $Si_xC_y$ material is typically formed.

It was also found that treatment of PSAB layers with $H_2$ plasma during or after pinning improves stress migration characteristics of interconnects. $H_2$ plasma chemically modifies the surface of the PSAB layer and leads to structures with lower stress migration, presumably also by slowing the migration of vacancies within the via. In some embodiments $H_2$ is included into the process gas used during pinning. Examples of mixtures of pinning reagents with $H_2$, which can be used include: $NH_3$ and $H_2$; $N_2$ and $H_2$; $NH_3$, $N_2$, and $H_2$; hydrocarbon, $NH_3$, and $H_2$; hydrocarbon, $N_2$, and $H_2$. In one embodiment, $H_2$ plasma treatment is used instead of pinning (no other pinning reagents added). Other combinations of pinning reagents (e.g., ternary mixtures) with hydrogen may be used, as will be understood by those of skill in the art. $H_2$ can be supplied into the process chamber at a flow rate ranging from 40 to 20000 sccm per four 300 mm wafers or 10 to 5000 sccm per one 300 mm wafer. In some embodiments $H_2$ comprises at least 0.01% of the total gas flow during pinning, preferably between 1 and 50%. Plasma, temperature, and pressure conditions for pinning which includes $H_2$, can be similar to those listed for $NH_3$ pinning.

In some embodiments, $H_2$ plasma treatment is performed after the pinning operation is completed, as shown by process block 313 of FIG. 3A. During $H_2$ plasma post-treatment, $H_2$ can be supplied to the process chamber either alone or concurrently with an inert carrier gas at a flow rate ranging from about 40 to 20000 sccm per four 300 mm wafers or 10 to 5000 sccm per one 300 mm wafer. Plasma, temperature, and pressure conditions for $H_2$ post-treatment can be similar to those listed above for $NH_3$ pinning operation. It is understood that $H_2$ plasma post-treatment, plasma pre-clean, passivation, and pinning operations are optional and may or may not be included into the process flow, depending on the particular chemistry of the process or the desired parameters of an interconnect.

Figure 3B:
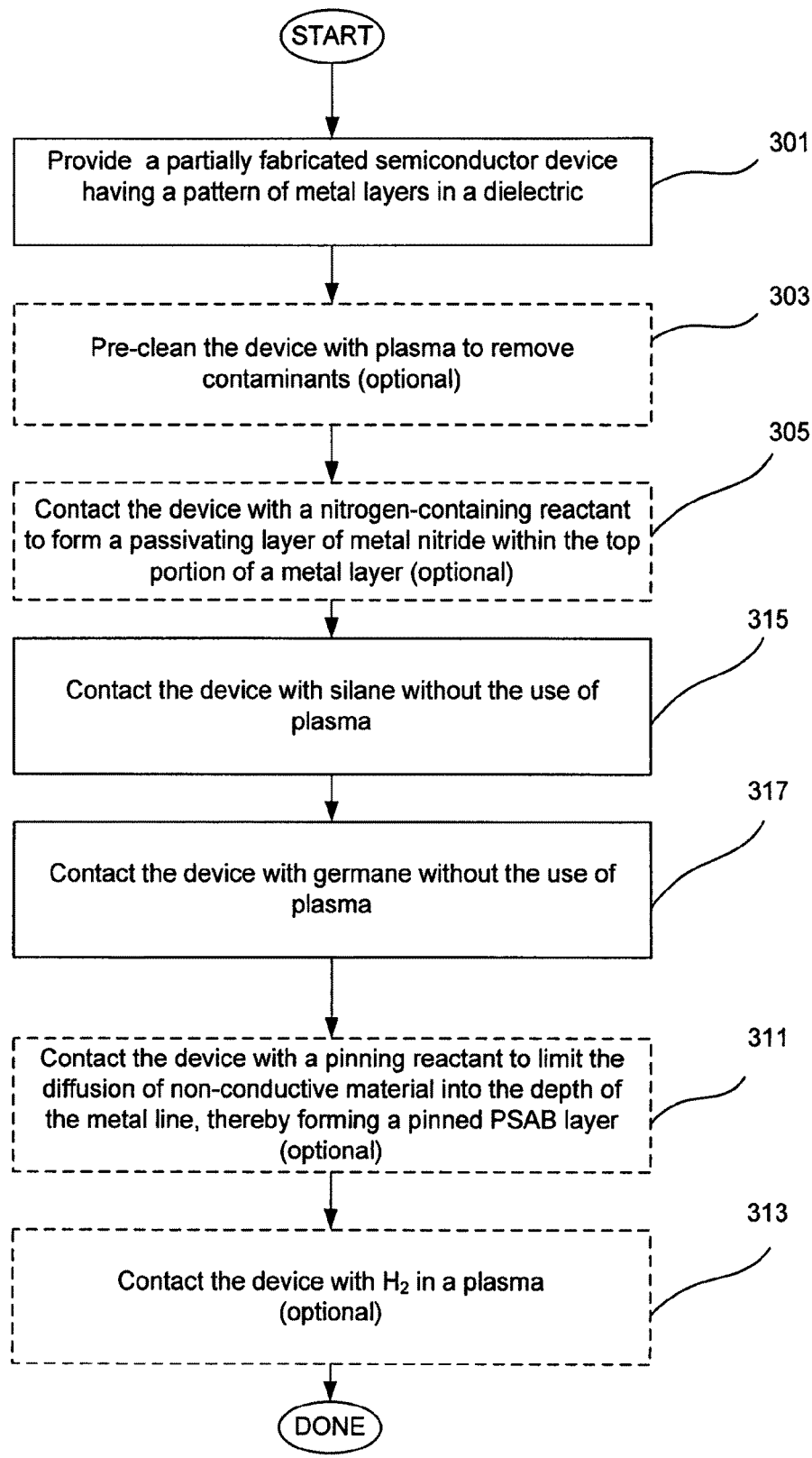

FIG. 3B presents a process flow diagram for a specific example of a PSAB forming process. In this embodiment the substrate is contacted with $SiH_4$ without the use of plasma to form a capping PSAB layer as shown in operation 315 followed by exposure to $GeH_4$ without the use of plasma to form an encapsulating PSAB layer as shown in operation 317. Other operations of the process are similar to those described in FIG. 3A. The process flow shown in FIG. 3B provides interconnects having good adhesion between copper and a dielectric diffusion layer, due to presence of silicon-containing material at this interface. These interconnects also have low resistance shift and good electromigration properties due to the presence of germanium-containing encapsulating layer.

After the processes illustrated in FIGS. 3A and 3B are completed, a dielectric diffusion barrier layer is deposited on top of the exposed PSAB layer 415 and a dielectric 401. Cross-sectional depiction of a resulting structure is shown in FIG. 4F. Dielectric diffusion barrier layer is preferably deposited in the same vacuum environment as the PSAB layers, without exposing the substrate to moisture or oxygen. In some embodiments the dielectric diffusion barrier is deposited in the same process chamber in which the PSAB layer has been deposited, e.g., in a process chamber of a PECVD apparatus. In other embodiments, it may be deposited in a different station of a multi-station apparatus or in a different chamber of a multi-chamber apparatus. The dielectric diffusion barrier may include, for example, silicon carbide based materials, such as silicon carbide, which may be doped with nitrogen, oxygen, boron etc. In some embodiments it is particularly desirable to use low-k diffusion barrier layers formed on top of PSAB-capped lines and ILD. In one embodiment use of oxygen doped silicon carbide (ODC) is particularly preferred. ODC material typically has a low dielectric constant (e.g., less than 4.0), and is therefore a desired diffusion barrier material. However, in the absence of PSAB capping, direct deposition of ODC layers on top of copper lines, resulted in oxidation of copper and deterioration of interconnect properties. PSAB technology allows use of ODC diffusion barrier formed on top of PSAB layer, since copper is protected from oxidation by PSAB material. ODC layers can be formed by PECVD using silicon, carbon, and oxygen-containing precursors.

In some embodiments deposition of a dielectric diffusion barrier layer is performed at a temperature that is higher than the temperature used in the PSAB formation (including passivation and pinning operations). For example, in some embodiments, PSAB formation is implemented at a temperature under 350° C., e.g., at about 250-300° C., while diffusion barrier deposition is performed at a temperature of at least about 350° C., e.g., 375-450° C.

After the diffusion barrier has been deposited, an interconnect may be formed using conventional Damascene processing, such as described with reference to FIGS. 1A-1E.

While not illustrated in the FIGS. 3 and 4, a metal cap may be formed on top of the PSAB layer prior to deposition of a dielectric diffusion barrier. Such metal caps can be formed from volatile metal halides or organometallic precursors (e.g., from $WF_6$) and are preferably deposited selectively on top of or within the exposed PSAB layers, without affecting the dielectric material. Advantageously such metal caps can be deposited in the same PECVD apparatus, as the PSAB layers and the dielectric diffusion barrier, without breaking the vacuum or exposing the substrate to moisture and oxygen.

The methods described above provide interconnects with good adhesion, low resistance shift and/or improved stress migration characteristics. The thickness of PSAB layers formed by these methods can range from about 10 Å to 10,000 Å. It is especially advantageous that these methods can provide PSAB layers with the thickness in the range of about 10-100 Å, particularly at a 10-60 Å range. PSAB films ranging in thickness from about 10 to 60 Å can provide interconnects with particularly small resistance shifts of less than 1% and less than 3%, that are currently demanded in the IC industry. When PSAB layers have graded composition, the thickness of a PSAB layer can be defined from the interface with a diffusion barrier layer to a point where the Cu concentration is at least 98 atomic %. In some embodiments, where PSAB layers comprise materials having relatively low resistivity (e.g., germanium-containing materials), the greater thicknesses of PSAB layers can be tolerated. For example, in one interconnect, PSAB-layers comprising silicon may be particularly thin (e.g., between about 5 to 60 Å), while germanium-containing portions of PSAB layers may be substantially thicker (e.g., from about 5 to 100 Å).

Interconnects having a combination of a silicon-containing capping PSAB layer and a germanium-containing encapsulating PSAB layer can afford improved adhesion without compromising the conductivity of the via. Thus, devices having an adhesion of copper to a dielectric diffusion barrier of greater than about 10 $J/m^2$, e.g., greater than about 20 $J/m^2$ can be obtained. The resistance shift for these devices typically does not exceed 3%. Further, use of interconnects having encapsulating PSAB layers can improve electromigration parameters of interconnect by protecting the interfaces of copper line.

Apparatus

The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing the PSAB layer and barrier layer deposition is transferred from one station to another within the reactor during the process. While in process, each wafer is held in place by a pedestal, wafer chuck and/or other wafer holding apparatus. For certain operations in which the wafer is to be heated, the apparatus may include a heater such as a heating plate. In one embodiment of the invention, a PECVD system may be used. In some embodiments, the PECVD system includes a LF RF power source.

Figure 5:
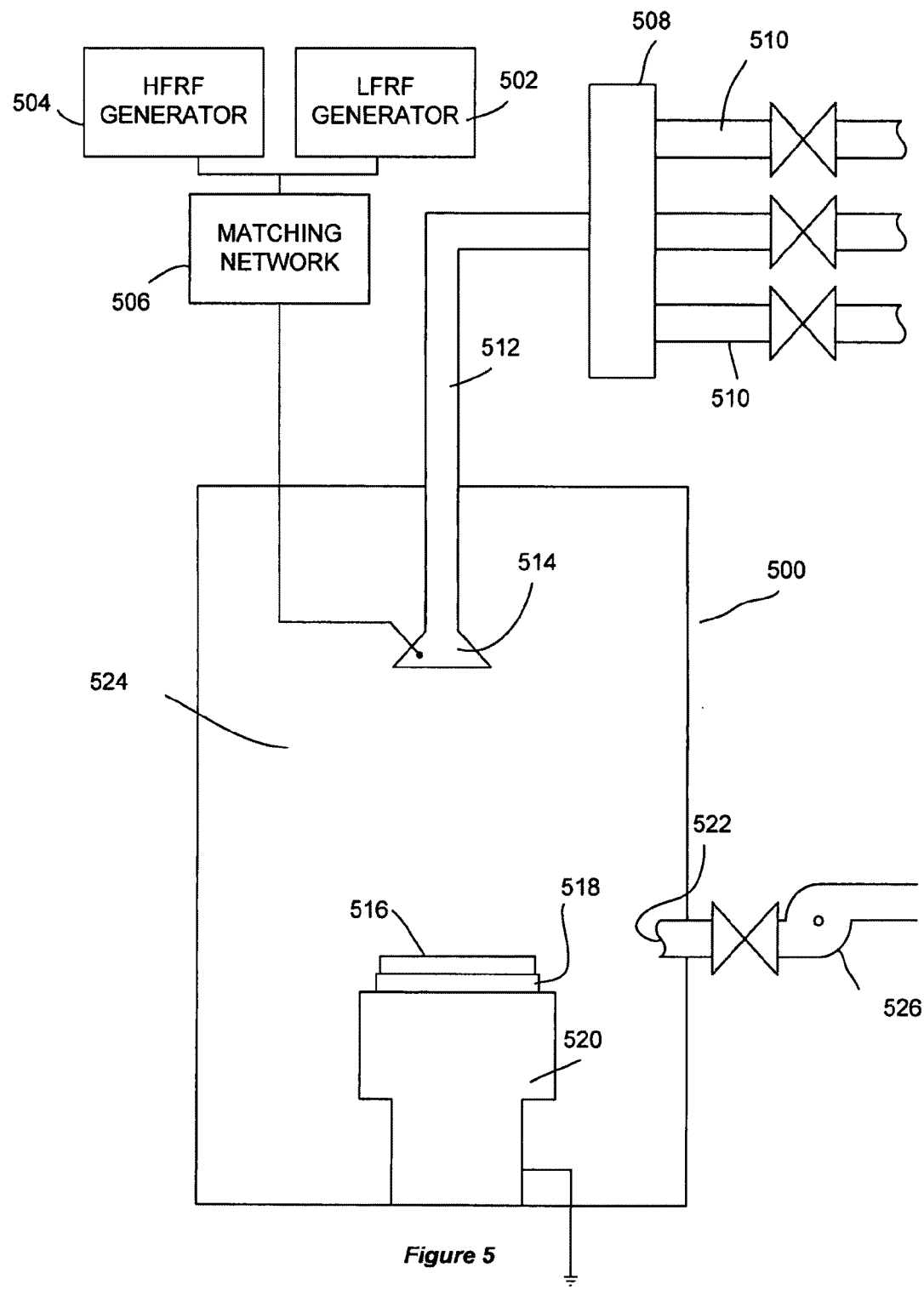
FIG. 5 is a schematic representation of a PECVD apparatus capable of using low frequency (LF) and high frequency (HF) radio frequency plasma sources that can be used for forming PSAB layers in accordance with some embodiments of present invention.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502 and a low-frequency RF generator 504 are connected to a matching network 506 that, in turn is connected to showerhead 514.

Within the reactor, a wafer pedestal 518 supports a substrate 516. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the pre-cleaning, passivation, PSAB formation and pinning phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 6:
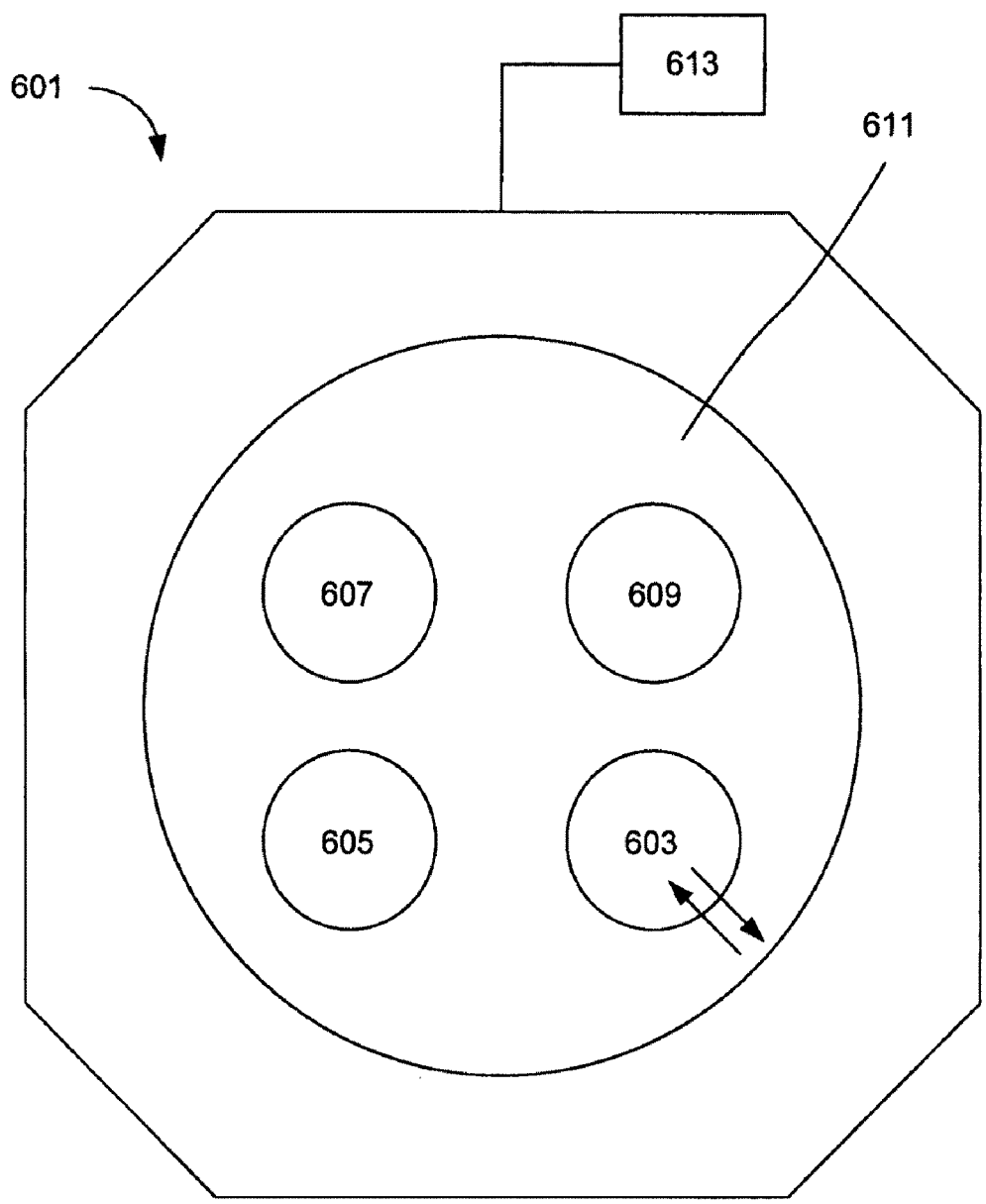
FIG. 6 is a schematic representation of one example of a multi-station apparatus suitable for forming PSAB layers in accordance with some embodiments of present invention.

In one of the embodiments a multi-station apparatus may be used for forming a PSAB layer and a diffusion barrier. The multi-station reactor allows one to run different processes concurrently in one chamber environment, thereby increasing the efficiency of wafer processing. One example of such an apparatus is depicted in FIG. 6. A schematic presentation of top view is shown. An apparatus chamber 601 comprises four stations 603-609. In general, any number of stations is possible within the single chamber of a multi-station apparatus. Station 603 is used for loading and unloading of the substrate wafers. An indexing plane 611 is used to index wafers from station to station. A controller 613 can comprise instructions for the processes described herein. Stations 603-609 may have the same or different functions. For example, some of the stations may be devoted to PSAB forming operation, while other stations may be used for depositing the dielectric diffusion barrier film.

In one of the embodiments, individual stations can operate under distinct process conditions and may be substantially isolated from each other. For example one station may operate under one temperature regime, while another may operate under a different temperature regime. In one example, at least 2 subprocesses of the PSAB-forming process are performed at different stations. For example, 2, 3, or 4 subprocesses may be performed in different stations.

In one embodiment, pre-cleaning operation, PSAB layer formation process and pinning are performed in one preferred temperature regime and are carried out in one station of the multi-station apparatus. The $H_2$ plasma post-treatment and deposition of a dielectric diffusion barrier may require a different temperature regime (e.g., a higher temperature), and may be carried out in a different station or stations. In other embodiments $H_2$ plasma post-treatment is performed under the same temperature regime as the PSAB formation and at the same station that performs PSAB formation. In some embodiments PSAB layer is formed at one station, and the wafer is then indexed to a different station where pinning is performed under a different temperature regime. In some embodiments, the capping PSAB layer is formed at one station, while an encapsulating PSAB layer is formed at a different station under a different temperature regime.

In some embodiments, the entire PSAB-forming process including pre-treatment, passivation, first PSAB layer formation, pinning, and $H_2$ plasma post-treatment is performed in one station of a single station or a multi-station apparatus. In some embodiments, deposition of a dielectric diffusion barrier layer may be also performed at the same station as PSAB layer formation.

In one embodiment, station 605 may be devoted to pre-clean and to formation of the PSAB layer. Station 605 may operate at a temperature range of about 200-300° C., which is preferred in some embodiments for both PSAB formation and pre-clean operation. The wafer is then indexed to station 607, where pinning operation is performed under a different temperature regime, e.g., at a temperature range of about 200-400° C. The wafer is then indexed to station 609, and next to station 603, where deposition of a dielectric diffusion barrier material, such as doped silicon carbide, is performed. Deposition of dielectric diffusion barrier can be performed for example in the temperature range of about 350 to 400° C., which is the preferred process temperature according in some silicon carbide deposition processes.

Formation of metal caps can also be integrated with the PSAB process and can be performed in a multi station tool shown in FIG. 6. For example, the substrate may be pre-cleaned at station 605, indexed to station 607 for a PSAB layer deposition, then indexed to station 609 for tungsten nucleation; and finally indexed to station 603 for tungsten cap growth.

According to one of the embodiments described above, station 605 is a pre-clean station and a PSAB formation station. Station 607 serves for $H_2$ plasma post-treatment and for deposition of dielectric diffusion barrier layer. Stations 607, 609, and 603 may all serve for deposition of dielectric diffusion barrier layer. An indexing plate 611 is used to lift the substrates off the pedestals and to accurately position the substrates at the next processing station. After the wafer substrate is loaded at station 603, it is indexed to station 605, where formation of the pre-clean and PSAB layer formation (including all its sub-processes except for $H_2$ post-treatment) is performed. The wafer is then moved to station 607 where $H_2$ plasma post-treatment and deposition of diffusion barrier dielectric is performed. The substrate is further indexed to station 609, where further deposition of barrier dielectric is performed, and then indexed to station 603 to deposit more of diffusion barrier dielectric. The processed wafer is unloaded at station 603, and the module is charged with a new wafer. During normal operation, a separate substrate occupies each station and each time the process is repeated the substrates are moved to new stations. Thus, an apparatus having four stations 603, 605, 607, and 609 allows simultaneous processing of four wafers, wherein at least one station performs a process that is different from the processes performed at other stations. Alternatively, four wafers may be subjected to identical operations at all four stations, without dedicating certain stations to deposition of a particular layer.

The process conditions and the process flow itself can be controlled by a controller unit 613 which comprises program instructions for a monitoring, maintaining and/or adjusting certain process variables, such as HF and LF power, gas flow rates and times, temperature, pressure and the like. For example, instructions specifying flow rates of silane and germane for PSAB deposition may be included. The instructions may specify all of the parameters to perform operations, according to methods described above. For example, instructions may include parameters of pre-clean, passivation, PSAB layer formation, pinning operations, $H_2$ plasma treatment, and dielectric diffusion barrier deposition The controller may comprise different or identical instructions for different apparatus stations, thus allowing the apparatus stations to operate either independently or synchronously.

Figure 7:
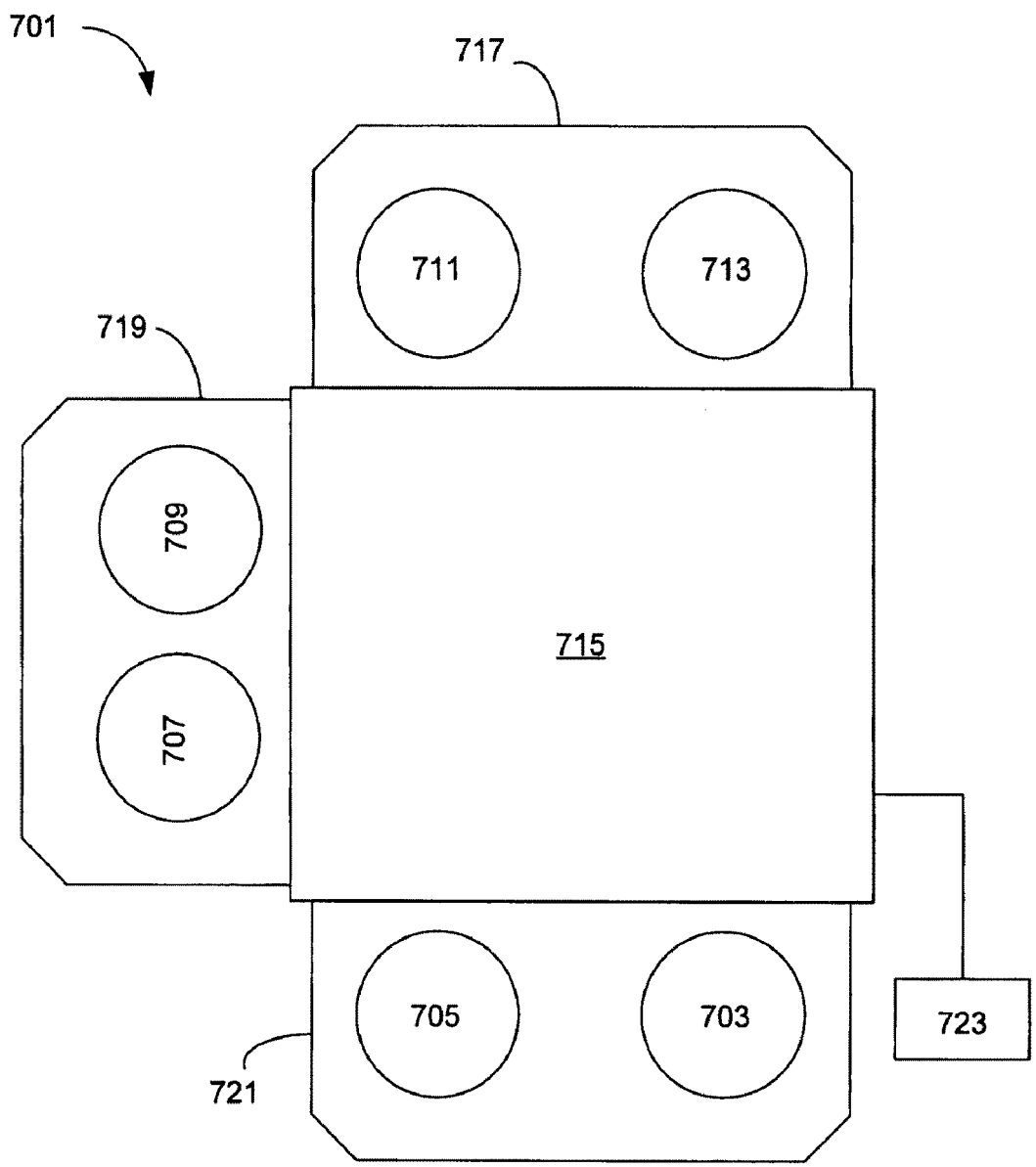
FIG. 7 is a schematic representation of another example of a multi-station apparatus suitable for forming PSAB layers in accordance with some embodiments of present invention.

Another example of a multi-station apparatus is illustrated in FIG. 7. The multi-station apparatus 701 includes six stations 703, 705, 707, 709, 711, and 713 residing in three separate processing chambers 717, 719, and 721, with two stations residing in each chamber. A robot-containing chamber 715 adjacent chambers 717, 719, and 721 provides mechanism for loading and unloading the wafers into the stations. A controller 723 provides instructions for operation of a multi-station apparatus 701. Individual stations within one chamber are isolatable from each other and may carry out identical or different operations. In one embodiment, two wafers are simultaneously transferred to stations 703 and 705 residing in one chamber 721 and simultaneously undergo identical operations including pre-clean, passivation, first PSAB layer formation and pinning. After this process is completed, the two wafers are removed from the chamber 721, and are simultaneously introduced to stations 707 and 709 residing in chamber 709. In this chamber, a diffusion barrier material layer is simultaneously deposited. The wafers are then removed from chamber 719, and are introduced to stations 711 and 713 residing in chamber 717, where further processing follows. In some embodiments, formation of PSAB layer may be performed in a multi-chamber apparatus with different PSAB subprocesses performed in different chambers. In some embodiments, at least two operations of the PSAB forming process are performed in different chambers of a multi-chamber apparatus. For example, PSAB layer can be formed in one chamber under a first temperature regime, while pinning operation can be performed in a different chamber under a different temperature regime.

There is a variety of ways, in which the PSAB forming process can be implemented in multi-station tools, such as those shown in FIG. 6 and FIG. 7. In general, the described PSAB process is easily integrated into the Damascene flow, does not require substantial resource-consuming handling of substrates, and can be performed in the same apparatus as a dielectric diffusion barrier deposition. Further, formation of an encapsulating germanium-containing PSAB layer is particularly advantageous since such layer can improve electromigration performance of an interconnect. Several embodiments of the described methods and devices will now be illustrated by specific examples.

EXAMPLES

Figure 8:
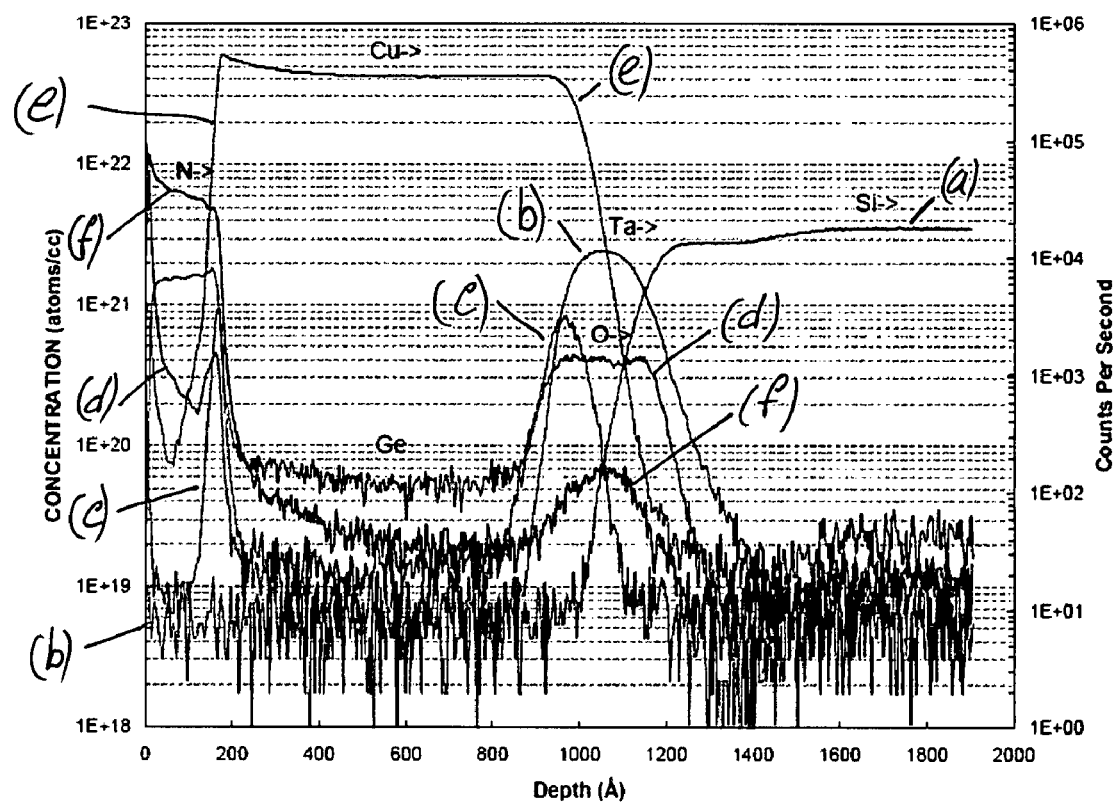
FIG. 8 is an experimental diagram, illustrating a Secondary Ion Mass Spectroscopy (SIMS) data for an interconnect fabricated according to a method described herein.

One example of a device, containing an encapsulating PSAB layer is illustrated in FIG. 8. FIG. 8 provides a Secondary Ion Mass Spectroscopy (SIMS) plot of an interconnect prepared according to a method described herein. The SIMS plot presents concentrations of various components in the device as a function of their position within an interconnect. Position at a zero angstrom depth corresponds to the surface of the dielectric diffusion barrier layer. Curves (a), (b), (c), (d), (e) and (f), present concentrations of Si, Ta, Ge, O, Cu, and N respectively. It can be seen that curve (c) corresponding to germanium concentration has two peaks corresponding to two portions of an encapsulating PSAB layer within the interconnect. One peak at the depth of about 190 Å corresponds to the "top" portion of an encapsulating PSAB layer at the interface between copper layer and the dielectric diffusion barrier, while the second peak at the depth of about 950 Å corresponds to the "bottom" portion of an encapsulating layer at the interface between copper layer and the tantalum diffusion barrier layer. It can also be seen that the concentration of silicon at about 190 Å is also high, corresponding to the silicon-containing capping PSAB layer.

Adhesion of the dielectric diffusion barrier to the metal line for such interconnect was measured using a standard adhesion test and was found to be greater than about 20 J/m².

The interconnect illustrated in FIG. 8 was fabricated according to the following process flow (Example 1):

The partially fabricated semiconductor device having an exposed pattern of copper lines in a dielectric was obtained after a CMP operation, and was placed into a process chamber of a PECVD VECTOR™ apparatus. The entire PSAB-forming process was performed at one station or at 2 stations of a four-station apparatus.

The 300 mm wafer was pre-heated at the first station at 275° C. and 2.3 torr for 60 seconds. $N_2$ was flowed into the chamber at a flow rate of 5000 sccm during pre-heating.

Then, the substrate was plasma pre-cleaned at the same station. $H_2$ was flowed at a flow rate of 4000 sccm; HF RF plasma power of 740-870 W was used (no LF power was applied). Pre-cleaning was performed at 4.2 torr and 275° C. for 15 seconds.

After pre-cleaning, the substrate was treated with $SiH_4$ without use of plasma at the same station. $SiH_4$ was introduced at 120 sccm flow rate concurrently with $H_2$ introduced at a flow rate of 4000 sccm. $SiH_4$ treatment was performed at 2.3 torr and 275° C. for 4 seconds.

Then the substrate was treated with $GeH_4$ at the same station. During $GeH_4$ treatment, $GeH_4$ was introduced at a flow rate of 50 sccm, $H_2$ was introduced at 9000 sccm and $N_2$ was introduced at 18000 sccm. $GeH_4$ treatment was performed at 1.5 torr and 275° C. for 2 seconds.

The substrate was then subjected to a pinning operation. Pinning was performed, in one example, at the same station as the previous operations at a temperature of 275° C. In another example, the substrate was transferred to a different station for pinning, which was performed at 350° C. During pinning, $NH_3$ was introduced at a flow rate of 7000 sccm, an $N_2$ at a flow rate of 2800 sccm. HF and LF RF plasma power was 490-560 W and 220-250 W respectively. Pinning was performed at 2.3 torr for 12 seconds.

After the PSAB layer has been deposited, the substrate was then transferred to a different station and a $Si_xC_yN_y$ diffusion barrier layer was deposited. During diffusion barrier deposition, tetramethylsilane was flowed at a flow rate of about 1260 sccm, $NH_3$ was flowed at 4600 sccm, and $N_2$ was flowed at 3000 sccm. Plasma was ignited at using HF power set at 275-300 W and LF power set at 241-275 W. Deposition was performed at 3.9 torr and 350° C.

Example 2

The 300 mm wafer was pre-heated at the first station at 275° C. and 2.3 torr for 60 seconds. $N_2$ was flowed into the chamber at a flow rate of 5000 sccm during pre-heating.

Then, the substrate was plasma pre-cleaned at the same station. $H_2$ was flowed at a flow rate of 4000 sccm; HF RF plasma power of 740-870 W was used (no LF power was applied). Pre-cleaning was performed at 4.2 torr and 275° C. for 15 seconds.

After pre-cleaning the substrate was treated with $SiH_4$ without use of plasma at the same station. $SiH_4$ was introduced at 120 sccm flow rate concurrently with $NH_3$ introduced at a flow rate of 4000 sccm. $SiH_4$ treatment was performed at 2.3 torr and 275° C. for 2 seconds.

Then the substrate was treated with $GeH_4$ at the same station. During $GeH_4$ treatment, $GeH_4$ was introduced at a flow rate of 50 sccm, $H_2$ at 9000 sccm and $N_2$ at 18000 sccm. $GeH_4$ treatment was performed at 1.5 torr and 275° C. for 2 seconds.

The substrate was then subjected to a pinning operation. Pinning was performed in one example, at the same station as the previous operations at a temperature of 275° C. In another example, the substrate was transferred to a different station for pinning, which was performed at 350° C. During pinning $NH_3$ was introduced at a flow rate of 7000 sccm, $N_2$ was introduced at a flow rate of 2800 sccm. HF and LF RF plasma power was 490-560 W and 220-250 W respectively. Pinning was performed at 2.3 torr for 12 seconds.

After the PSAB layer has been deposited, the substrate was then transferred to a different station and a $Si_xC_yN_y$ diffusion barrier layer was deposited. During diffusion barrier deposition, tetramethylsilane was flowed at a flow rate of about 1260 sccm, $NH_3$ was flowed at 4600 sccm, and $N_2$ was flowed at 3000 sccm. Plasma was ignited at using HF power set at 275-300 W and LF power set at 241-275 W. Deposition was performed at 3.9 torr and 350° C.

Example 3

The 300 mm wafer was pre-heated at the first station at 275° C. and 2.3 torr for 60 seconds. $N_2$ was flowed into the chamber at a flow rate of 5000 sccm during pre-heating.

Then, the substrate was plasma pre-cleaned at the same station. $H_2$ was flowed at a flow rate of 4000 sccm; HF RF plasma power of 740-870 W was used (no LF power was applied). Pre-cleaning was performed at 4.2 torr and 275° C. for 15 seconds.

After pre-cleaning the substrate was treated with $SiH_4$ without use of plasma at the same station. $SiH_4$ was introduced at 120 sccm flow rate concurrently with $H_2$ introduced at a flow rate of 4000 sccm. $SiH_4$ treatment was performed at 2.3 torr and 275° C. for 4 seconds.

Then the substrate was treated with $GeH_4$ at the same station. During $GeH_4$ treatment, $GeH_4$ was introduced at a flow rate of 50 sccm, and $H_2$ at 9000 sccm. $GeH_4$ treatment was performed at 1.5 torr and 275° C. for 2 seconds.

The substrate was then subjected to a pinning operation. Pinning was performed in one example, at the same station as the previous operations at a temperature of 275° C. In another example, the substrate was transferred to a different station for pinning, which was performed at 350° C. During pinning $NH_3$ was introduced at a flow rate of 7000 sccm, an $N_2$ at a flow rate of 2800 sccm. HF and LF RF plasma power was 490-560 W and 220-250 W respectively. Pinning was performed at 2.3 torr for 12 seconds.

After the PSAB layer has been deposited, the substrate was then transferred to a different station and a $Si_xC_yN_y$ diffusion barrier layer was deposited. During diffusion barrier deposition, tetramethylsilane was flowed at a flow rate of about 1260 sccm, $NH_3$ was flowed at 4600 sccm, and $N_2$ was flowed at 3000 sccm. Plasma was ignited at using HF power set at 275-300 W and LF power set at 241-275 W. Deposition was performed at 3.9 torr and 350° C.

Example 4

The 300 mm wafer was pre-heated at the first station at 275° C. and 2.3 torr for 60 seconds. $N_2$ was flowed into the chamber at a flow rate of 5000 sccm during pre-heating.

Then, the substrate was plasma pre-cleaned at the same station. $H_2$ was flowed at a flow rate of 4000 sccm; HF RF plasma power of 740-870 W was used (no LF power was applied). Pre-cleaning was performed at 4.2 torr and 275° C. for 15 seconds.

After pre-cleaning the substrate was treated with $GeH_4$ (no silane soak was used in this example). During $GeH_4$ treatment, $GeH_4$ was introduced at a flow rate of 50 sccm, and $H_2$ was introduced at 9000 sccm. $GeH_4$ treatment was performed at 1.5 torr and 275° C. for 2 seconds.

The substrate was then subjected to a pinning operation. Pinning was performed in one example, in the same station as the previous operations at a temperature of 275° C. In another example, the substrate was transferred to a different station for pinning, which was performed at 350° C. During pinning $NH_3$ was introduced at a flow rate of 7000 sccm, an $N_2$ at a flow rate of 2800 sccm. HF and LF RF plasma power was 490-560 W and 220-250 W respectively. Pinning was performed at 2.3 torr for 12 seconds.

After the PSAB layer has been deposited, the substrate was then transferred to a different station and a $Si_xC_yN_y$ diffusion barrier layer was deposited. During diffusion barrier deposition, tetramethylsilane was flowed at a flow rate of about 1260 sccm, $NH_3$ was flowed at 4600 sccm, and $N_2$ was flowed at 3000 sccm. Plasma was ignited at using HF power set at 275-300 W and LF power set at 241-275 W. Deposition was performed at 3.9 torr and 350° C.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of forming a layer of material at least on or within a copper portion of a partially fabricated semiconductor device having an exposed pattern of copper lines in a dielectric, the method comprising:
   (a) contacting the partially fabricated semiconductor device with a metal-containing or a boron-containing precursor in a first chemical vapor deposition (CVD) process station to deposit a layer of metal or boron at least on or within the copper portion of the partially fabricated semiconductor device;
   (b) treating the partially fabricated semiconductor device formed after (a) with a pinning reagent selected from the group consisting of $NH_3$, $N_2$, a gas from the family of methyl-substituted amines, a hydrocarbon, and $H_2$, in a plasma, wherein the treating modifies the layer of metal or boron deposited in (a);
   (c) depositing a layer of dielectric material onto an exposed surface of the partially fabricated semiconductor device obtained after (b), in a second chemical vapor deposition process station, wherein the first chemical vapor deposition process station and the second chemical vapor deposition process stations reside within one CVD process tool.

2. The method of claim 1, wherein the metal-containing precursor comprises a material selected from the group consisting of a metal hydride, metal halide, and an organometallic compound.

3. The method of claim 2, wherein the metal-containing precursor comprises an organometallic compound.

4. The method of claim 3, wherein the organometallic compound is selected from the group consisting of an alkyl-containing organometallic compound, a carbonyl-containing organometallic compound, and a cyclopentadienyl-containing organometallic compound.

5. The method of claim 4, wherein the organometallic compound is selected from the group consisting of tetrakis-dimethylaminotitanium, a cyclopentadienyl-substituted molybdenum compound, a nickel tetracarbonyl, and an iron pentacarbonyl.

6. The method of claim 1, wherein the metal of the deposited metal layer is capable of forming an alloy with copper.

7. The method of claim 6, wherein the metal is selected from the group consisting of titanium, molybdenum, nickel, and iron.

8. The method of claim 1, wherein (a) comprises contacting the partially fabricated semiconductor device with a boron-containing precursor.

9. The method of claim 1, wherein the boron-containing precursor comprises diborane.

10. The method of claim 1, wherein (a) is performed without forming a plasma.

11. The method of claim 1, wherein treating the partially fabricated semiconductor device formed after (a) but prior to (c) with a pinning reagent, is performed in the same station of CVD apparatus as operation (a).

12. The method of claim 1, wherein treating the partially fabricated semiconductor device formed after (a) but prior to (c) with a pinning reagent, is performed in a different station of the CVD apparatus than the station where operation (a) is performed.

13. The method of claim 1, wherein the layer of dielectric material deposited in (b) is a layer of dielectric diffusion barrier material.

14. The method of claim 1, wherein the layer of dielectric material comprises silicon carbide or silicon nitride, wherein silicon carbide is doped or undoped, and wherein silicon nitride is doped or undoped.

15. The method of claim 14, wherein the layer of dielectric material comprises $Si_xC_yN_z$.

16. The method of claim 1, wherein the layer of metal or boron has a thickness of about 10-10,000 Å.

17. The method of claim 1, wherein the layer of metal or boron has a thickness of about 10-100 Å.

18. The method of claim 1, wherein the layer of metal or boron has a thickness of about 10-60 Å.

19. The method of claim 1, wherein the first CVD station and the second CVD station reside in one chamber of a plasma-enhanced chemical vapor deposition (PECVD) tool.

* * * * *

UNITED STATES PATENT AND TRADEMARK OFFICE
CERTIFICATE OF CORRECTION

PATENT NO.      : 7,576,006 B1
APPLICATION NO. : 11/888323
DATED           : August 18, 2009
INVENTOR(S)     : Yu et al.

Page 1 of 1

It is certified that error appears in the above-identified patent and that said Letters Patent is hereby corrected as shown below:

(column 29, line 34) "stations" should read --station--.

(column 30, line 28) "(b)" should read --(c)--.

Signed and Sealed this
Fifth Day of July, 2011

David J. Kappos
*Director of the United States Patent and Trademark Office*